United States Patent
Kambhampati et al.

(10) Patent No.: US 8,565,281 B2
(45) Date of Patent: Oct. 22, 2013

(54) METHOD OF PUMPING QUANTUM DOTS

(75) Inventors: Patanjali Kambhampati, Lachine (CA); Ryan Cooney, Montreal (CA); Samuel Sewall, Montreal (CA)

(73) Assignee: The Royal Institute for the Advancement of Learning/McGill University, Montreal (CA)

(*) Notice: Subject to any disclaimer, the term of this patent is extended or adjusted under 35 U.S.C. 154(b) by 449 days.

(21) Appl. No.: 12/961,631

(22) Filed: Dec. 7, 2010

(65) Prior Publication Data
US 2011/0133100 A1  Jun. 9, 2011

Related U.S. Application Data

(60) Provisional application No. 61/267,121, filed on Dec. 7, 2009.

(51) Int. Cl.
*H01S 3/091* (2006.01)
(52) U.S. Cl.
USPC .............................. 372/75; 372/69
(58) Field of Classification Search
USPC ...................................... 372/69, 75
See application file for complete search history.

(56) References Cited

U.S. PATENT DOCUMENTS

2005/0082543 A1* 4/2005 Alizadeh et al. ............ 257/79
2007/0215857 A1* 9/2007 Saito ............................ 257/14

* cited by examiner

*Primary Examiner* — Kinam Park
(74) *Attorney, Agent, or Firm* — The Law Office of Michael E. Kondoudis

(57) ABSTRACT

Strongly confined semiconductor quantum dots theoretically offer for broadband and continuous tunability of their emitting wavelength based upon simply varying the particle size. However, prior art consistently has demonstrated a lower particle size limit below which optical gain cannot be achieved, for example 2.3 nm for CdSe in toluene. As such the prior art points to combinations of alternative materials and host media as the route to achieving the goal of broadband emission sources using quantum dots. However, according to the invention optical gain can be achieved in quantum dots below these previous experimental limits by resonantly pumping the quantum dots to a specific excitonic state, i.e. electron position relative to the quantum dot, such that the multiexcitonic interferences are minimized. Using this approach optical gain in CdSe of R=2.1 nm and 1.5 nm has been demonstrated in the yellow/amber region of the visible spectrum.

15 Claims, 17 Drawing Sheets

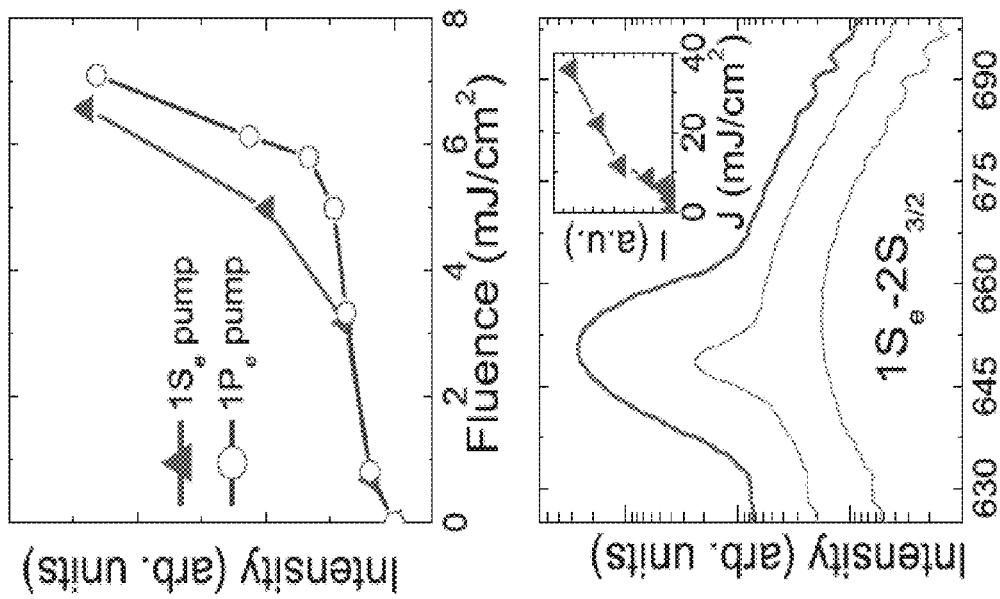
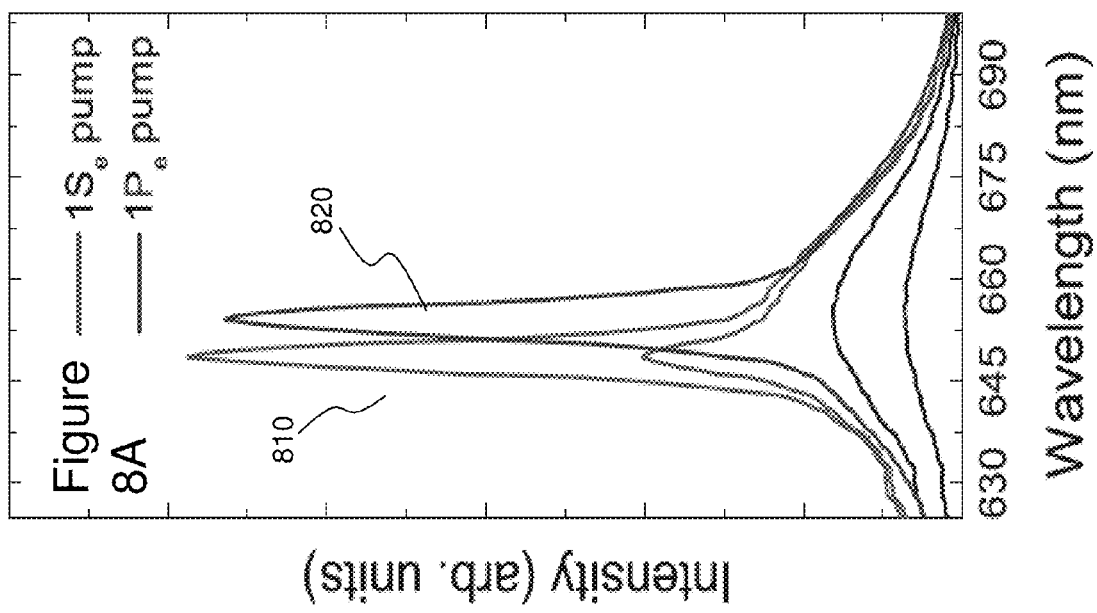
Figure 8A
Figure 8B
Figure 8C

METHOD OF PUMPING QUANTUM DOTS

CROSS-REFERENCE TO RELATED APPLICATION

This patent application claims the benefit of U.S. Provisional Patent Application 61/267,121 filed Dec. 7, 2009 entitled "Method of Pumping Quantum Dots."

FIELD OF THE INVENTION

This invention relates to quantum dots and more specifically to a method of pumping quantum dots of any dimension.

BACKGROUND OF THE INVENTION

The science of photonics includes the generation, emission, transmission, modulation, signal processing, switching, amplification, detection and sensing of light. Whilst a proportion of the population are aware that photonics has enabled the explosion of bandwidth and services accessible to them within the field of telecommunications and the Internet, and a much larger proportion are probably aware of solar cells and their ability to generate electricity from the sun, everyone is aware of lights and how they impact their daily life allowing essentially any activity other than sleeping outside the hours the sun is over the horizon.

Solid State Lighting: The ability to generate light with electricity by Sir Humphrey Davy 200 years ago sparked a century of development by the likes of Thomas Edison, Joseph Swan, Sandor Just (tungsten filaments), and Irving Langmuir (inert gas instead of vacuum) leading to the establishment 100 years ago of tungsten filament lamps, which as the dominant light source have fundamentally shifted how people live, work, play. However, their efficiency is woefully low, being only 2.1% for a 60 W incandescent light and only 3.5% for a quartz halogen. Accordingly there is a massive worldwide campaign to replace incandescent lights by compact fluorescent lights (CFL) with an efficiency of 22% thereby reducing energy consumption significantly. However, CFLs are not a panacea as issues exist including lifetime, health and safety issues from mercury content, UV emissions, health issues for some individuals, radio interference, low luminance, dimming, and recycling due to the phosphor and mercury. Further CFL efficiency drops with increasing/decreasing temperature from room temperature and non-operation is typical below freezing.

However, a monochromatic solid state light source within the visible wavelength range can achieve in principle an efficiency approaching 100%. Additionally solid state light sources should also reduce consumption of precious metals, reduce recycling, remove health/safety issues and permit operation at all temperatures. Beneficially solid state light sources by virtue of their small size, low weight, and low voltage operation can also be employed in a wide range of situations where incandescent or CFL lights cannot. At present niche applications such as holiday decorations in conjunction with indicator lighting in panels, backlighting in LCD displays etc mean that solid state lighting sales today account for only approximately 2% of the current lighting market and will grow to only approximately 3% in 2011.

Despite this solid state lighting is a massive market which according to NextGen Research ("LEDs and Laser Diodes: Solid State Lighting Applications, Technologies, and Market Opportunities", February 2009, http://www.nextgenresearch.com/research/1001995-LEDs_and_Laser_Diodes) forecasts the overall solid-state lighting (SSL) market will achieve worldwide revenues topping approximately $22 billion in 2011 and $33 billion by 2013. The illumination segment of the LED market will see compound annual growth rate (CAGR) of nearly 22% in the 2009-2013 timeframe. The display portion of the market also will achieve a five-year CAGR of over 14% as cities worldwide shift their streetlights to these more energy-efficient and ecologically friendly solutions. However, the majority of this growth will be generated from niche lighting applications including architectural, task lighting, medical and off-grid lighting applications rather than the residential lighting market according to The Strategy Analytics ("LED Device and Material Market Trends", June 2009, http://www.strategyanalytics.com/default.aspx?mod=ReportAbstractViewer&a0=4788).

As such the majority of the lighting market, which in 2011 will be approximately 97% representing approximately $700 billion in revenue, remains inaccessible despite the considerable research effort and investment expended to date. Hence, for solid state lighting applications the ultimate goal is a high efficiency white LED allowing access to this vast currently inaccessible market.

However, prior art LED structures whilst offering a fairly broad wavelength range operate at relatively low efficiencies and typically three LED devices are required to even cover a substantial portion of the wavelength range to which the human eye is responsive, the so-called visible wavelength range, which is 380 nm to 750 nm. As such red, green and blue centered LED devices are typically used to create the impression of white, of which blue LEDs were the last to be developed based upon InGaN structures. At present the challenges in realizing suitable LED technologies and devices for lighting applications include their relatively low internal quantum efficiency, low light extraction efficiencies realized, and the relatively high device fabrication costs. Blue LEDs also form the basis of many "white" LEDs today that employ a phosphor-conversion scheme, but which sets the ultimate quantum efficiency of these "white" LEDs to below 65%.

The increase in efficiency of LEDs by the introduction of quantum confined structures, such as quantum wells, multi-quantum wells etc also results in a narrowing of the optical emission from the source. Accordingly, with prior art solutions increasing the efficiency of the sources require that number of sources required to "blend" together for the desired white light also increases thereby impacting the financial aspects of employing solid state lighting. It is in this regard that the high luminescence efficiencies, low fabrication costs, and processibility of semiconductor nanostructures have made them promising candidates for future lighting devices and the subject of considerable research and development. These semiconductor nanostructures include quantum dots and nanowires.

Solar Cells: The ability to generate electricity from sunlight has been touted as one of the means along with water and wind for reducing society's dependency upon fossil fuels and an alternative to increasing the number of nuclear power stations. In many parts of the world access to dependable wind or water as a means of generating power does not exist, added to which such installations tend to be geared to generating significant power to support industry and/or urban environments. However, solar power may be deployed essentially anywhere and can augment as well as replace conventional means of generating electricity. With the sun providing roughly 200 $Wm^{-2}$ the global energy consumption in 2005 was 0.014% of the solar energy reaching the earth, and projections for 2100 are 0.051%. Hence solar power should be able to provide sufficient energy for most of our needs. In 2005 solar cells accounted for only 0.0037% of energy consumption globally. By 2050 that is expected to increase to 30.7% even whilst global consumption increases nearly 200% in the same time frame. Accordingly projections for this still as yet emerging market are for massive revenue growth long-term although short-term factors such as oil prices, Government policies make projections short-term difficult. As a benchmark roughly 0.01% of global energy production, based upon 40% CAGR from 2005, represented 2008 revenues of $37.1 billion. Solar cells in 2008 averaged $3/W (http://www.solarbuzz.com/Marketbuzz2009-intro.htm).

By far, the most prevalent material for solar cells is bulk (i.e. wafer) silicon, be it monocrystalline, polycrystalline, or amorphous with efficiencies from 6% to 14-19%. Existing commercial alternatives include thin film cadmium telluride, copper indium selenide (14%), and copper indium gallium selenide (19%) although current manufacturing costs are significantly higher than silicon. Much research and development is focused to multi-junction cells, for example consisting of GaAs, Ge, and GaInP which offer efficiencies from approximately 30% to over 40% but at present such cells cost about one hundred times as much as an 8% efficient amorphous silicon cell in mass production whilst only delivering about four times the electrical power. As such these multi-junction cells have tended to be deployed in space applications. Multi-junction cells partition the spectrum into bands such that a different semiconductor absorbs each band, an approach similar to that outlined above to provide a "white" light source from multiple LEDs.

Increasing the efficiency of semiconductor photodetectors without introducing avalanche multiplication by the introduction of quantum confined structures, such as quantum wells, multi-quantum wells etc similarly results in a narrowing of the optical absorption as it does a narrowing of emission from optical emitters. Accordingly, with prior art solutions increasing the efficiency of the photodetectors requires that number of photodetectors required to "blend" together to cover the full solar spectrum also increases. As such high absorption efficiencies coupled with potentially low fabrication costs and processibility of semiconductor nanostructures have made them promising candidates for future solar cell devices and the subject of considerable research and development. These semiconductor nanostructures include quantum dots and nanowires.

InGaN, Nanowires and Quantum Dots: With the recent discovery that the band gap of indium nitride (InN) was approximately 0.7-0.8 eV (1750 nm), see for example J. Yu et al in "Unusual Properties of the Fundamental Band Gap of InN," (Appl. Phys. Lett., Vol. 80, pp. 4741, 2002) and T. Matsuoka in "Optical Bandgap Energy of Wurtzite InN" (Appl. Phys. Lett., Vol. 81, pp. 1246 (2002)), is combined with the fact that the bandgap of GaN is at approximately 3.3 eV (370 nm), and these represent the extremes of the quaternary alloy InGaN then the absorption of this alloy can be continuously tuned from ~0.7 eV to 3.3 eV, thereby matching almost perfectly to the solar spectrum. As such InGaN has also emerged as a promising material for future high-efficiency full solar spectrum solar cells, E. Trybus et al "InN: A Material with Photovoltaic Promise and Challenges" (*J. Crystal Growth*, Vol. 288, No. 2, pp. 218-224, 2006) as well as for light sources (LEDs).

It would be apparent to one skilled in the art that in order to provide a full solar spectrum solar cell it should be structured so that the material at the front of the solar cell absorbs the shortest wavelengths and progressively longer wavelengths are absorbed by layers within the solar cell towards the lowermost surface. As such, the material within a full solar spectrum solar cell should grade from $In_xGa_{1-x}N$ where $x \approx 1$ to $In_yGa_{1-y}N$ where $y \approx 0$, i.e. be formed with InN at the substrate. Additionally the growth of InN onto compatible substrates, i.e. silicon, should be achieved relatively free of defects allowing not only the stress free growth of the necessary nanowire structures but also to facilitate the inclusion of multiple quantum wells, quantum dots and quantum-dots-within-quantum-dots which allow the efficiency of the solar cell to be improved.

Whilst the prior art includes growth of InN nanowires using foreign metal catalysts via the vapor-liquid-solid growth mechanism, see for example J. Li et al in U.S. Pat. No. 6,831,017 entitled "Catalyst Patterning for Nanowire Devices and C. Liang et al in "Selective-Area Growth of Indium Nitride Nanowires on Gold-Patterned Si(100) Substrates" (Appl. Phys. Lett., Vol. 81, 22 (2002), and spontaneous formation under nitrogen rich conditions; see for example C-K Chao et al "Catalyst Free Growth of Indium Nitride Nanorods by Chemical Beam Epitaxy" (Appl. Phys. Lett., Vol. 88) and S. Hersee et al in U.S. Pat. No. 7,521,274 entitled "Pulsed Growth of Catalyst-Free Growth of GaN Nanowires and Application in Group III Nitride Semiconductor Bulk Material", each presents significant drawbacks for solar cells or solid state lighting applications including tapered morphology with large variations in the wire diameter along the wire length, substantial growth variations with compositional change, non-uniform nanowire length, as well as defects and stress which degrade quantum well and quantum dot structures.

Recent developments from the University of McGill however have demonstrated very high quality, uniform diameter and height nanowires of InN on silicon without foreign metal catalysts, see Y. Chang et al "Molecular Beam Epitaxial Growth and Characterization of Non-Tapered InN Nanowires on Si(111)" (Nanotechnology, Vol. 20, 2009) and Z. Mi et al in U.S. patent application Ser. No. 12/956,039 entitled "Method of Growing Uniform Semiconductor Nanowires without Foreign Metal Catalyst and Devices Thereof" thereby forming the basis for potential high efficiency, low cost, solar cells based upon these nanowires with graded composition, quantum wells and quantum dots. The growth technique by virtue of being applicable to group III nitrides with wurtzite structure was also used to grow nanowire GaN light sources with internal quantum efficiencies of 45% with unique quantum well and quantum-dot-within-a-quantum-dot structures, see Y. Chang et al in "High Efficiency Green, Yellow and Red Emission from InGaN/GaN Dot-in-a-Wire Heterostructures on Si(111)" and Z. Mi et al in US Patent Application "Method of Growing Uniform Semiconductor Nanowires without Foreign Metal Catalyst and Devices Thereof" and devices thereof" entitled "Method of Growing Uniform Semiconductor Nanowires without Foreign Metal Catalyst and Devices Thereof." Such efficient green, yellow, and red emissions augmenting the existing GaN based blue LEDs.

Accordingly a "white" light source may be composed by assembling high efficiency blue, green, yellow, and red InGaN/GaN quantum-dot and nanowire based LEDs with suitable optical sub-assemblies to provide the necessary diffuse source without significant additional loss. Such assemblies whilst anticipated as commercially feasible require several LEDs to be manufactured on different silicon wafers, separated, assembled onto a carrier and electrically interconnected adding additional material costs and labor as well as increasing final "white" light source costs through yield reductions etc. Additional applications for high efficiency sources, which have not been reviewed in detail, include those within telecommunications at wavelengths such as 850 nm, 1300 nm, and 1550 nm in the near infrared.

Similarly a full spectrum solar cell exploiting high efficiency quantum dot and nanowire based p-i-n photodetectors would require assembly from multiple devices covering the near-ultraviolet (near-UV), blue, green, yellow, and red together with probably multiple devices covering the first near-infrared (near-IR) region of ~750 nm to ~1300 nm, and second near-IR region of ~1500 nm to ~1750 nm Again such multiple "colour banded" solar cells like "white" light sources requiring additional optical elements to split the incoming spectrum efficiently to each "colour banded" solar cell, multiple solar cells to be manufactured on different silicon wafers, separated, assembled onto a carrier and electrically interconnected adding additional material costs and labor as well as increasing final full spectrum solar cell costs through yield reductions etc. However, such an approach given the efficiencies of quantum dot and nanowire based solar cells are anticipated to be commercially feasible.

Colloidal Quantum Dots: It is within this context that semiconductor quantum dots, nanometer sized semiconductor particles which act as a very small "box" for electrons, and potentially the most efficient light sources offer a solution to reducing the number of discrete high efficiency LEDs/"colour banded" photodetectors required in white LED sources/ full solar spectrum photodetectors and have thus formed the subject of significant research. Whilst one dimensional (1D) confinement of charge carriers in semiconductor quantum wells is now a well established method of enabling efficient optical gain and lasing, with improved performance metrics such as occupation thresholds, gain coefficients, differential gain, and temperature stability, it was predicted that three dimensional (3D) carrier confinement would increase the density of band-edge states relative to these 1D systems, further improving the performance of these materials as optical emitters or absorbers, see for example M. Asada et al (IEEE J. Quantum Electron., Vol. 22, 1986).

Strongly confined semiconductor quantum dots being particularly appealing, as 3D spherical confinement partitions the bulk electronic structure of the material into discrete transitions whose quantized energy levels are a pronounced function of particle size. Not only does this confinement allow for continuous tunability of the emission wavelength, but should also, in principle, result in reduced lasing thresholds with an associated enhancement of the differential gain which is particularly important for high efficiency optical sources, see V. I. Klimov (Semiconductor and Metal Nanocrystals: Synthesis and Electronic and Optical Properties, Published by Marcel Dekker, New York, 2004) and V. I. Klimov (Annu. Rev. Phys. Chem., Vol. 58, pp 635, 2007). Furthermore, it has been predicted that the occupation thresholds necessary to develop population inversions in these materials, as well as the differential gain in terms of state filling, should be entirely independent of particle size, see V. I. Klimov supra. As such, it was anticipated that strongly confined semiconductor quantum dots would be a universal, size tuneable, and highly efficient gain medium.

Much of the appeal of the colloidal quantum dot is that it can be readily integrated with other technology platforms at very low cost and that by varying the physical dimensions of the quantum dots they can be made to emit/absorb at points across the entire visible spectrum. Accordingly providing colloidal quantum dots with a range of dimensions within the same localized region acts to provide the required multiple sources to "blend" together to provide the illusion of a "white" light source or allows the same localized region to absorb photons over a wider wavelength range. Colloidal quantum dots are finding applications outside of photonics including for example their use in biological and chemical applications including providing markers and tags.

Limited Tunability: Recent work demonstrated the tunability of optical amplification and lasing using the size-dependent transition energies of strongly confined colloidal CdSe quantum dots, see for example V. I. Klimov et al (Science, Vol. 290, pp 314, 2000), Y. Chan et al (Appl. Phys. Lett., Vol. 85, 2004), and M. Caruge et al (Phys. Rev. B, Vol. 70, 2004). Unfortunately, these works have yet to realize the predicted size-universal development of optical gain in these systems, and are in general characterized by the need for specific host media, and progressively larger occupation thresholds as the particle radii are reduced. The difficulties arise due to the confinement enhanced interactions of the multiple excitations required to develop population inversions in the emitting transition, as well as the depletion of high energy charge carriers into surface or interface states, see for example R. R. Cooney et al in "Gain Control in Semiconductor Quantum Dots via State-Resolved Optical Pumping" (Phys. Rev. Lett., Vol. 102, 2009). In colloidal suspensions these impeding influences only allowed optical gain to be verified in relatively large particles.

A key result from the prior art is that multiexcitonic interactions related to quantum size effects may fundamentally impede the development of optical gain in strongly confined quantum dots. These confinement enhanced interactions result in a shift of the transition energies, often manifesting themselves as photonic absorption (PA) in the transient absorption (TA) spectra of these materials. In general, excited state charge distributions, in both the intrinsic quantized manifolds, as well as the extrinsic surface and interface states, are capable of producing this level shifting. Specific to CdSe quantum dots, excitations generally red shift the band-edge absorbing transition precisely into the region of the spontaneous photoluminescence (PL). Rather than generate optical gain under intense optical pumping, the complex interplay of the multiexcitonic interactions in the strongly confined quantum dot yields a PA at precisely the emitting wavelength. It is this confinement enhanced PA which is largely responsible for impeding the development of optical gain in these systems. The first demonstration of size-tunable optical gain in strongly confined semiconductor quantum dots was provided by V. I. Klimov (see supra) and illustrated that the development of optical gain in CdSe quantum dots was strongly dependent on the identity of their matrix material. Though the confinement based tunability of optical amplification was demonstrated, it could be achieved only under specific sample conditions.

In subsequent years, optical gain was observed in CdSe quantum dots in their native solution, but only for the largest particle sizes. It was argued that confinement enhanced multiexcitonic interactions competed with, and often completely overwhelmed, the development of optical gain for smaller particles. As the radii were reduced the observed occupancy threshold increased as a direct result of the increasing size dependent influence of the interfering PA. In hexane solution, optical gain could not be demonstrated in particles with radii smaller than 2.3 nm, thereby removing a significant portion of the spectral range arising from confinement based tunability. Furthermore, this work suggested potentially fundamental barriers related to quantum size effects. Similar results have been obtained in related materials such as CdS, PbS, PbSe, generally accompanied by even larger thresholds and smaller differential gains.

In addition to the multiexcitonic interactions, which were believed to result in gain blocking, it was believed that the gain lifetime in these quantum dots would be too short, due to enhanced Auger recombination rates. In order to bypass the perceived limitations of quantum dots, alternative materials such as quantum nanowires (rods or whiskers) were investigated. The underlying premise was that the nanowires may have more favourable gain characteristics due to weaker multiexciton interactions and/or slower Auger recombination times. In these systems there have been indications that the interfering multiexcitonic interactions and the development of optical gain were sensitive to the excitation wavelength.

Accordingly the last decade of prior art suggests that the pathway to a universal, size tunable nanocrystalline gain material lies either with development of new materials, see for example S. A. Ivanov et al (J. Phys. Chem. B, Vol. 108, 2004), S. Link et al (J. Appl. Phys., Vol. 92, 2002), M. Kazes et al (J. Phys. Chem. C, Vol. 111, 2007), H. Htoon et al (Appl. Phys. Lett., Vol. 82, 2003), V. I. Klimov et al (Nature, London, Vol. 447, 2007) and J. Nanda et al (J. Phys. Chem. C, Vol. 111, 2007) or with new host media, see for example V. I. Klimov et al (Science, Vol. 290, 2000), H-J. Eisler et al (Appl. Phys. Lett., Vol. 80, 2002) and Y. Chan et al (Appl. Phys. Lett., Vol. 85, 2004).

Universal Gain Behaviour: Accordingly, neither approach within the prior art of different materials or host media addresses the goal of providing quantum dots, either as discrete elements of, or as a part of either a light emitting source or a light absorbing detector that provide the required optical performance over a broad wavelength range by employing a wide distribution of particle dimensions. Even if the desired result is obtained in the future with new materials and new host media these must be compatible with semiconductor materials, semiconductor processing techniques, meet the environmental and performance requirements of the application over the intended wavelength range of the device. At present multiple materials and multiple host media are required to cover even the visible spectrum of 350 nm-750 nm without considering wider ranges such as the near-infrared or operation and tunability within the telecommunications windows between 1250 nm and 1650 nm.

It would therefore be beneficial to minimise the interference mechanisms that occur within smaller radii quantum dots such that optical emission is possible at all dimensions of quantum dot so that a single material/host can be employed in the applications discussed supra.

SUMMARY OF THE INVENTION

It is an object of the present invention to obviate or mitigate at least one disadvantage of the prior art.

In accordance with an embodiment of the invention there is provided a method comprising:

providing a quantum dot, the quantum dot characterized by at least a first dimension and comprising at least a shell of a first material and a first electron of a plurality of electrons;

providing an optical signal, the optical signal determined in dependence upon at least the first material and the first dimension;

coupling the optical signal to the quantum dot, the coupling moving the first electron of the plurality of electrons to a predetermined position in relationship to the surface of the quantum dot; wherein the predetermined position is determined in dependence upon reducing a measure of interference for multiexcitonic interactions within the quantum dot such that spontaneous emission can occur from the quantum dot.

In accordance with another embodiment of the invention there is provided a method comprising:

providing a plurality of quantum dots, plurality of quantum dots characterized by at least a first dimension and each comprising at least a shell of a first material and a first electron of a plurality of electrons;

providing a first optical signal, the first optical signal determined in dependence upon at least the first material and the first dimension;

providing a second optical signal, the second first optical signal determined in dependence upon at least the first material and the first dimension;

coupling the first optical signal to the plurality of quantum dots, the coupling moving a first predetermined portion of the first electrons of the plurality of electrons to a first predetermined position in relationship to the surface of their respective quantum dots;

coupling the second optical signal to the plurality of quantum dots, the coupling moving a second predetermined portion of the first electrons of the plurality of electrons to a second predetermined position in relationship to the surface of their respective quantum dots; wherein the first predetermined position is determined in dependence upon reducing a measure of interference for multiexcitonic interactions within the quantum dot such that spontaneous emission can occur from the quantum dot.

In accordance with another embodiment of the invention there is provided a method comprising:

providing an optical emitter for emitting an optical signal determined in dependence upon at least a first material and a first dimension, the optical emitter comprising a semiconductor structure of which a first predetermined portion comprises a wurtzite semiconductor whose growth was initiated by providing nano scale droplets of a group III element constituent of the wurtzite semiconductor on the surface of the substrate and absent both a foreign catalyst and other constituent elements of the wurtzite semiconductor;

providing at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

In accordance with another embodiment of the invention there is provided a an optical emitter for emitting an optical signal determined in dependence upon at least a first material and a first dimension, the optical emitter comprising a semiconductor structure of which a first predetermined portion comprises a wurtzite semiconductor whose growth was initiated by providing nano scale droplets of a group III element constituent of the wurtzite semiconductor on the surface of the substrate and absent both a foreign catalyst and other constituent elements of the wurtzite semiconductor;

at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

In accordance with another embodiment of the invention there is provided a method comprising:

providing an optical emitter for emitting an optical signal determined in dependence upon at least a first material and a first dimension;

providing at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

In accordance with an embodiment of the invention there is provided a device comprising:

an optical emitter for emitting an optical signal determined in dependence upon at least a first material and a first dimension;

at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 8A depicts the ASE spectra for 2.9 nm CdSe/ZnS quantum dots for varying excitonic transitions;

FIG. 8B depicts the fluence dependent emission intensity of the ASE for each excitonic transitions;

FIG. 8C depicts the obscuring of photoluminescence spectra with ASE at increased optical pump fluence;

DETAILED DESCRIPTION

Figure 1A:
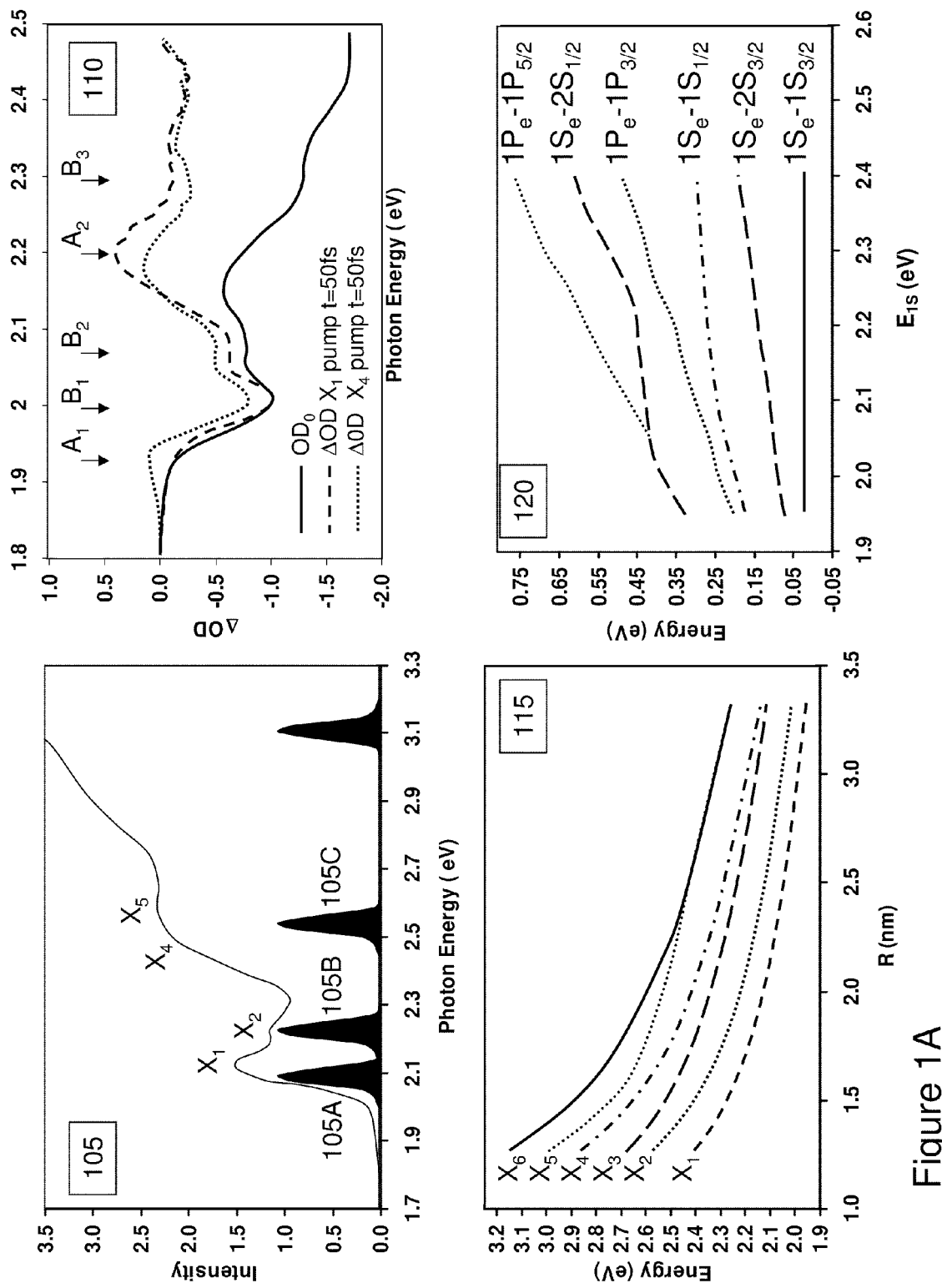
FIG. 1A depicts excitonic states of a quantum dot and the manner in which spectroscopically probing dynamical processes with state specificity can be performed.

The present invention is directed to the growth of InGaN nanowires and devices thereof for high efficiency solid state light sources.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Reference is made below to excitonic states, the notations of these excitonic states used here was taken from the multiband effective mass approach implemented by Efros et al (Annu. Rev. Mater. Sci., Vol. 30, 2000) commonly used when describing experimental data. For example, the fourth resolvable transition in the linear absorption spectrum, commonly referred to as $1S_e$-$2S_{1/2}$ in the multiband effective mass picture is known to have contributions from overlapping states with a 1P type electronic state. In addition the third resolvable transition, $1P_e$-$1P_{3/2}$, is known to have contributions from optical transitions with 1S electronic character. We merely use these term symbols as shorthand notation. Further, atomistic calculations of Zunger et al (J. Phys. Chem. B, Vol. 102, 1998) suggest that the third and fourth strongly allowed transitions $1P_e$-$1P_{3/2}$ and $1S_e$-$2P_{1/2}$ are nearly completely 1P type in the state of the electron, an assignment that has recently been supported experimentally. Here we will continue to denote these transitions as $1P_e$-$1P_{3/2}$ and $1S_e$-$2P_{1/2}$, for the sake of maintaining convention with commonly used notation in the experimental literature. Regardless of the theoretical approach, it is known that these higher lying transitions have significant P electron character.

Influence of Excitonic State on the Development of Gain:

Referring to FIG. 1 there is shown a representative absorption spectrum in first graph 105 of colloidal CdSe quantum dots showing clear transitions, which can be assigned to specific excitonic states, depending upon the level of theory employed. Also shown are laser spectra tuned in resonance with these excitonic states in order to perform excitonic state-resolved spectroscopy. Also shown are the variations in excitonic state with quantum dot radius in third graph 115 and variations in excitonic state versus ground excitonic state in fourth graph 120. Importantly the lower excitonic states are quantized and as the energy increases then the density of states and ultimately converges to a continuum. Accordingly with quantized excitonic eigenstates one can anticipate exploiting these discrete transitions to probe processes with excitonic state selectivity. With tunable femtosecond laser pulses in which the pump and probe pulses are tuned to specific transitions then the dynamics of interest can be extracted. For example first laser spectrum 105A corresponds to electronically cold band edge exciton X1 whilst second and third laser spectra 105B and 105C then the system is pumped into different excitons corresponding to either a hot hole (X2) or a hot electron (X4).

Figure 1B:
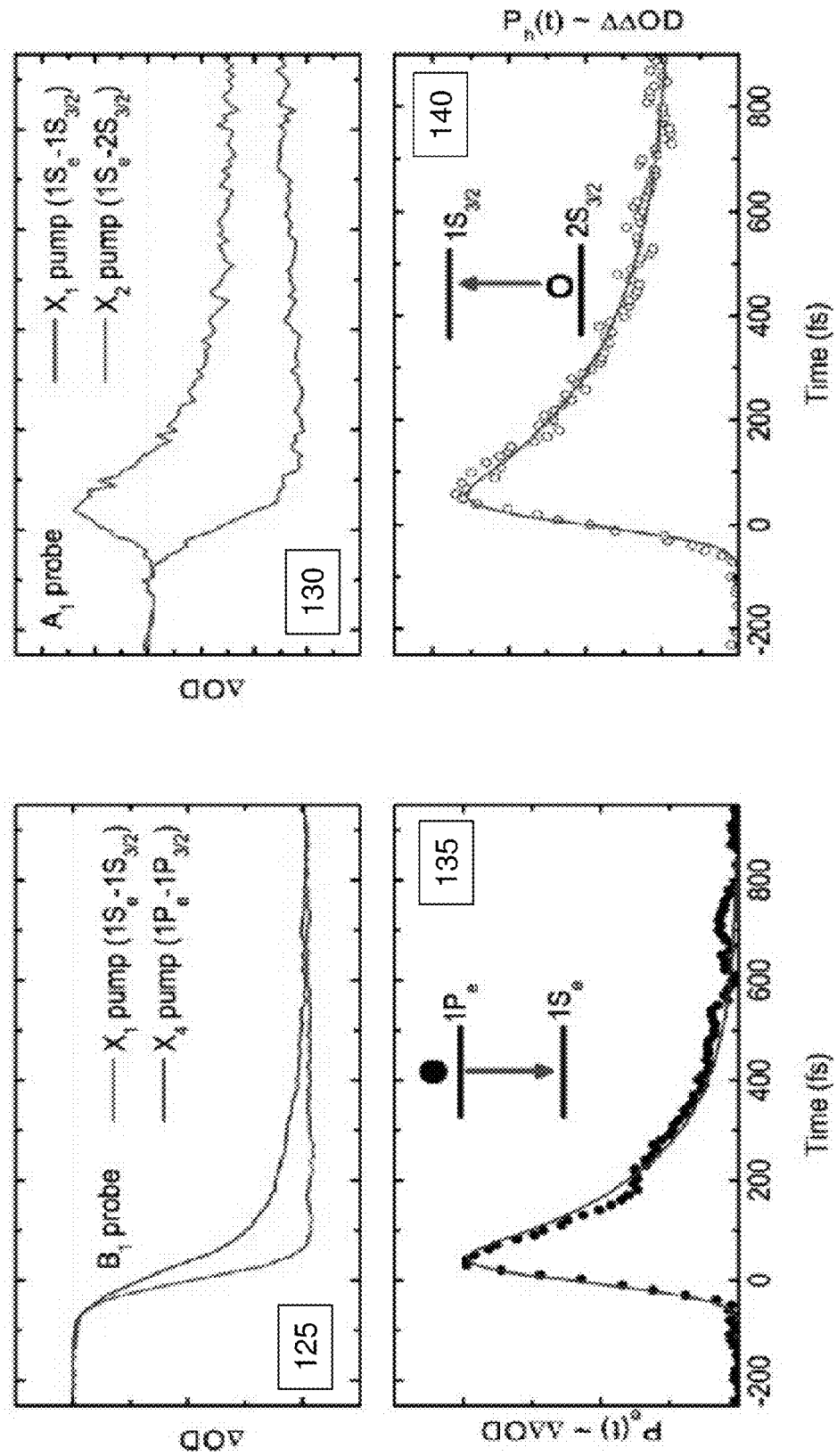
FIG. 1B depicts state-resolved exciton dynamics within a quantum dot observed by femto second pump/probe spectroscopy.

The results of this state-resolved approach can be seen in second graph 110 in FIG. 1A wherein time-resolved transient absorption (TA) spectrum for excitation into the X4, being the $1P_e$-$1P_{3/2}$ Transition, is shown revealing rich dynamics with time. Referring to second graph 110 there is shown the TA spectrum upon excitation into the X1 and X4 states at 50 fs revealing clear differences between the bleaching (B1, B2, etc) and absorptive (A1, A2, etc) signals based upon initial excitonic state. The probed spectral region can be appropriately selected to reveal specific dynamic processes. For example the B1 feature arises from state filling of the 1S electron level and first and third graphs 125 and 135 respectively of FIG. 1B show the differences in the B1 transients that reflect electron relaxation dynamics. Similarly the A1 spectral feature reflects the charge distribution of the exciton. Hence in a situation in which the electron is in the same state (X1 and X2) the differences in the A1 transients shown in second and fourth graphs 130 and 140 of FIG. 1B reflect hole relaxation dynamics.

Accordingly, with judicious choice in the initially pumped excitonic state and the spectral feature probed, we are now able to reduce a many-level system to an effective two-level system. Hence, we can measure well specified population dynamics corresponding to transitions from the first excited state to the lowest state for both electrons, third graph 135, and holes, fourth graph 140. Exploiting these techniques the inventors have demonstrated that the interfering multiexcitonic interactions are dependent on the identity of the excitons involved, see S. Sewell et al (J. Chem. Phys., Vol. 129, 2008), wherein pulsed excitation of the quantum dot at a resolvable transition of the linear absorption spectrum yielded dynamics of the interfering photoinduced absorption (PA) showing that the magnitude and temporal profile of multiexcitonic interactions were dependent on the initially prescribed excitonic states.

Increasing the excitonic energy resulted in larger PAs but resonant excitation of the band-edge absorbing transition minimized this interfering feature. Accordingly dependence of the interfering PA on the initially pumped excitonic state implies that a capacity for strongly confined colloidal quantum dots to develop optical gain may in fact state-dependent. If we consider that low energy excitons have been shown to reduce the magnitude of the interfering multiexcitonic interaction, the anticipation is that the lower energy excitons would also optimize the development of optical gain in these systems and this was observed experimentally by the inventors, see R. Cooney et al (Phys. Rev. Lett., Vol. 102, 2009). State-resolved excitation of the transitions in the linear absorption spectrum demonstrated that the development of optical gain was strongly state dependent. In general, band-edge excitation optimized the differential gain, occupation threshold, and gain cross section.

Figure 1C:
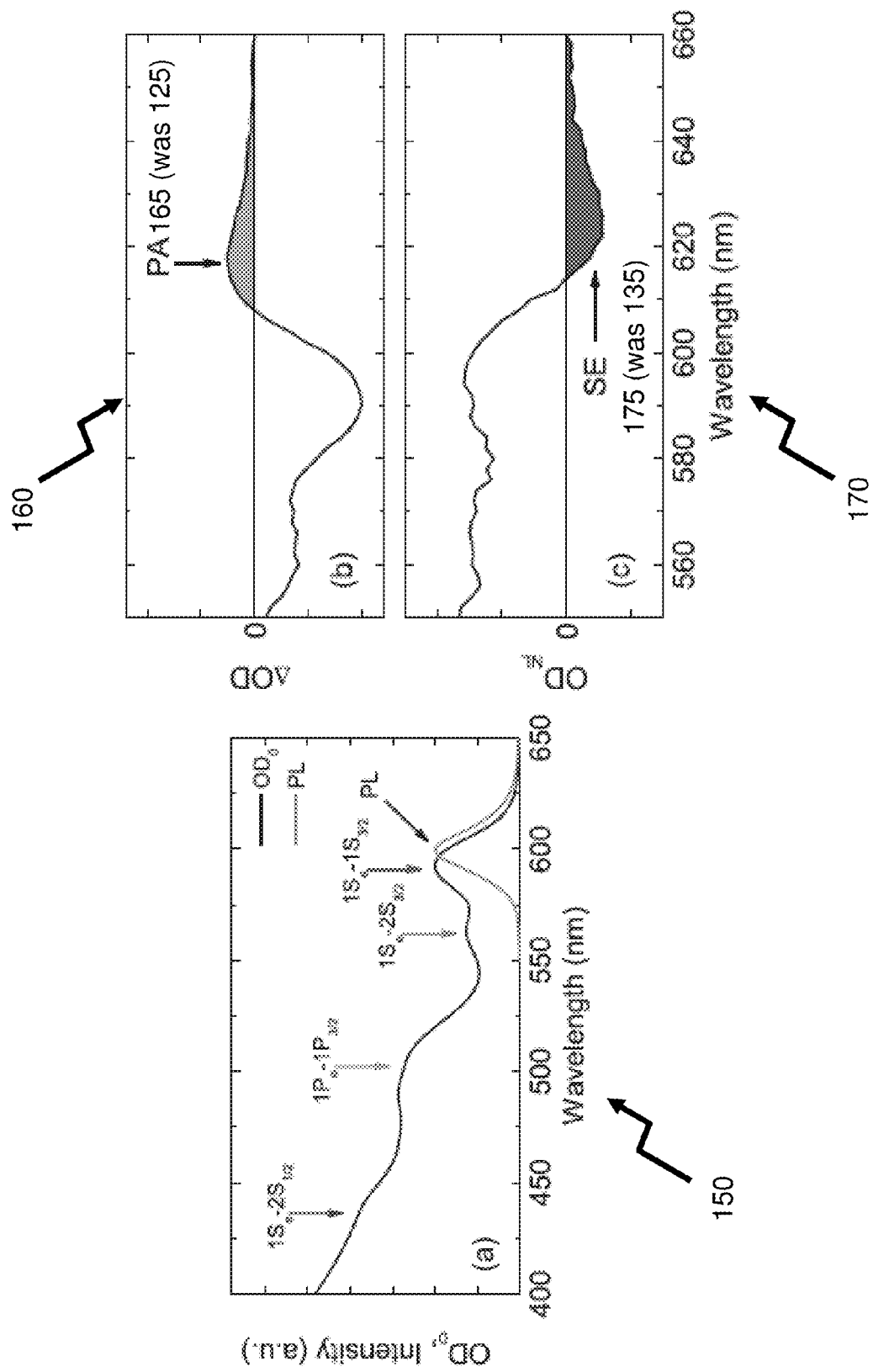
FIG. 1C depicts time resolved absorption and emission spectra for a 2.1 nm cadmium selenium (CdSe) quantum dot.

Referring to FIG. 1C there is depicted first graph 150 which plots the linear absorption ($OD_0$) and spontaneous PL spectra of a typical sample of colloidal CdSe quantum dots ($\lambda_{1S}$=591 nm, R=2.1 nm) dispersed in toluene. The partitioning of the bulk electronic structure into discrete transitions, denoted by the atomic like term symbols $1S_e$-$2S_{1/2}$ etc as well as the Stokes shifting of the emitting transition are evident in the $OD_0$ plot. Also shown is the PL plot with the peak emission at $\lambda_{1S}$=591 nm. Also shown is second graph 160 that plots the TA spectrum ($\Delta OD$) for the same CdSe quantum dot sample 100 fs after a low fluence optical excitation of the $1P_e$-$1P_{3/2}$ transition. An important feature in the transient spectrum, in the context of optical gain, is the PA 165 to the red of the bandedge transition, precisely in the region of the spontaneous PL. Third curve 170 depicts the nonlinear spectrum ($OD_{NL}$=$\Delta OD$−$OD_0$) 1 ps after a high fluence excitation of the $1P_e$-$1P_{3/2}$ transition. As such, the negative spectral feature indicated in the figure, SE 175, is a direct measurable indication of the probe pulse experiencing stimulated emission or optical gain, due to populations induced by the pump pulse. The PA 165 in second curve 160 resides precisely in the region of the optical gain seen in third curve 170. It is this interfering feature; attributed to a biexcitonic interaction, which competes with, and often impedes, the development of optical gain in these quantum dot systems, see R. Cooney et al (Phys. Rev. Lett., Vol. 102, 2009).

It is established in the literature that this interfering PA arises due multiexcitonic interactions that red shift the bandedge $1S_e$-$2P_{1/2}$ transition and that importantly, charge carriers residing in both the intrinsic quantized states of the quantum dot or in extrinsic states related to the particle's surface can induce level shifting manifested as the PA. In the early time low fluence data of second curve 160, the charge carriers have not yet been trapped at the particle surface and the PA reflects a biexcitonic binding energy between the $1P_e$-$1P_{3/2}$ and $1S_e$-$2P_{1/2}$ excitons. In general, spherical confinement enhances these multiexcitonic interactions relative to bulk systems, and we observe larger PAs as the radii of the quantum dots is decreased, see S. Sewall et al (J. Chem. Phys., Vol. 129, 2008). It is this size dependence that explains the inability of smaller colloidal quantum dots to generate optical gain, as discussed supra in respect of the prior art not demonstrating optical gain at all quantum dot dimensions and the resultant searches for alternative quantum dot materials and/or host media. Importantly, it has also been established by the inventors that the precise nature of the charge distribution, specifically the state of the exciton, has an influence on both the magnitude and temporal profile of this interfering feature, R. Cooney et al (Phys. Rev. Lett., Vol. 102, 2009).

Previously, the inventors in conjunction with others in S. Sewall et al (Phys. Rev. B, Vol. 74, 2006) investigated the influence of different initially created excitons on the behaviour of the interfering PA in colloidal CdSe quantum dots dispersed in toluene. In those state-resolved pump/probe experiments, resonantly excitation of the three lowest resolvable transitions in the linear absorption spectrum ($1S_e$-$2S_{1/2}$, $1S_e$-$2S_{1/2}$, $1P_e$-$1P_{3/2}$) at low fluence in the linear excitation regime, as well as the commonly employed pumping according to the prior art at $\lambda$=400 nm (3.1 eV), was performed and the transient dynamics recorded of the interfering PA. From this it was evident that the nature of the induced absorption was dramatically dependent on the initial identity of the optically created exciton, with a general increase in magnitude during the early time dynamics (0-2 ps) as the exciton energy is increased. These early time dynamics reflect the intraband relaxation of the initially created exciton and the capacity of a particular intrinsic charge distribution to red shift the band-edge transition to compete with the influence of state filling. As the exciton relaxes in the quantized manifold of conduction and valence states, the positive-going influence of the biexcitonic signal is reduced and the negative going influence of state filling is enhanced. This implies that higher energy excitons are associated with larger biexcitonic binding energies, which manifest themselves as larger PAs. Importantly, the biexcitonic interaction of the photoexcited band-edge ($1S_e$-$2S_{1/2}$) transition was insufficient to overcome to influence of state filling. Of the available excited charge distributions the $1S_e$-$2S_{1/2}$ exciton minimized the PA due to biexcitonic interactions, implying a smaller binding energy. Interestingly, well after intraband relaxation can be expected to be complete (0-3 ps) significant deviations in the PA signal based on the initial excitonic state were observed. Accordingly, a second slower process was also contributing to the interfering PA and overcoming the spontaneous emission such that smaller quantum dots did not exhibit optical gain.

On timescales longer than intraband relaxation, and shorter than recombination, the only process available to the exciton is surface trapping, and we have attributed this intermediate temporal behaviour to the depletion of charge carriers to extrinsic states related to the surface/matrix of the quantum dot. Accordingly the extrinsic state of the exciton also impacts the optical gain properties. After about 15-20 ps, in the particular size dispersion employed by the inventors, S. Sewall et al (Phys. Rev. B, Vol. 74, 2006), namely $\lambda_{1S}$=570 nm, R=1.8 nm and toluene, the exciton established a quasi-equilibrium between occupation of the lowest energy intrinsic band-edge state and extrinsic surface/matrix states. This quasi-equilibrium was evident in the convergence of the signals, with surface-type populations responsible for the slight positive going signal on the 100 ps timescale. On this timescale, which is longer than the gain lifetime (see Universal Optical Gain section subsequently), the same final state was reached regardless of initial state. Interestingly, this assignment implies that the rate of surface trapping, or the manner in which this quasi-equilibrium is established, is also dependent on the state of the charge carriers.

The state-dependent differences on the intermediate timescale of the PA suggest that some hot charge carriers are being directly trapped in the surface/matrix states prior to intraband relaxation. If all charge carriers underwent complete intraband relaxation prior to surface trapping, rather than reaching their lowest energy states via surface/matrix mediated channels; the PA signals should meet on the ~3 ps timescale. Furthermore, if we consider that all excitonic energy in excess of the band-edge transition will invariably be transferred to the hole states via sub-picosecond Auger mediated electron relaxation, we can specifically assign this behaviour to the direct depletion of high energy valence hole states into the surface/matrix states. Importantly, the state dependence of the surface depletion and biexcitonic binding energies reflected in the interfering PA has been shown to manifest itself as a state dependence for the development of optical gain in these systems.

Figure 2:
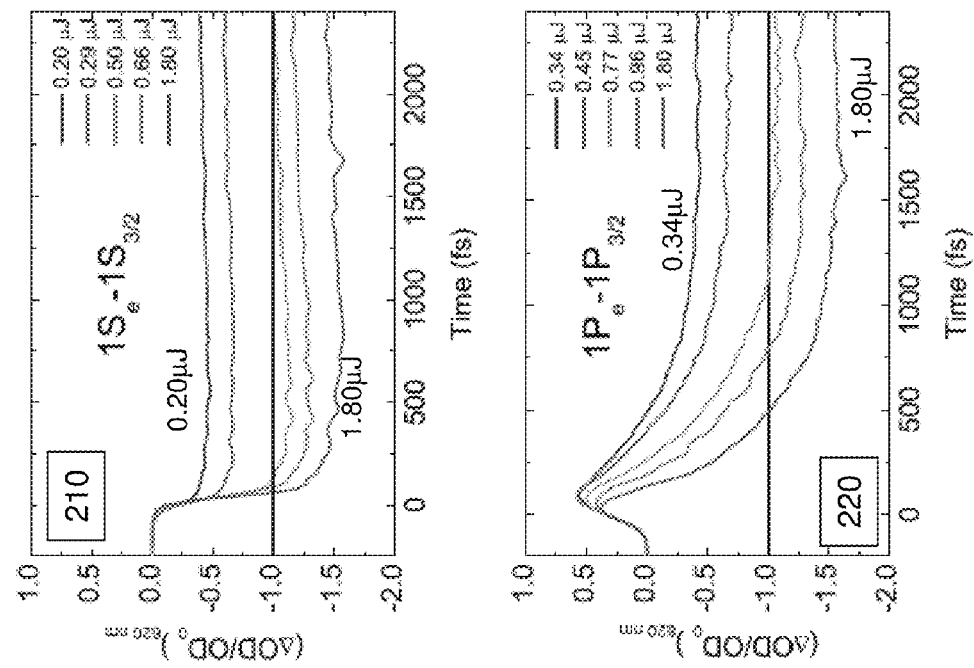
FIG. 2 depicts the fluent dependent transient dynamics of optical gain for 2.1 nm CdSe quantum dot for resonant excitation of S and P electron transitions.

This interplay between the development of optical gain in colloidal CdSe quantum dots and the state-dependent interference of the PA is illustrated in FIG. 2 as first and second graphs 210 and 220 which show the fluence dependent transient dynamics of the first 2 ps for the optical gain region ($\lambda_{probe}$=620 nm) following excitation of the $1S_e$-$1S_{3/2}$ ($\lambda_{PUMP1}$=590 nm) and $1P_e$-$1P_{3/2}$ ($\lambda_{PUMP2}$=500 nm) transitions, respectively. These measurements were performed at six levels for each of first graph 210 and second graph 220, being 0.20 µJ, 0.29 µJ, 0.50 µJ, 0.66 µJ and 1.80 µJ. These state-resolved pump/probe measurements were taken on colloidal CdSe quantum dots with $\lambda_{1S}$=591 nm and R=2.1 nm which were dispersed in toluene. The solid horizontal in each of first graph 210 and second graph 220 corresponds to the threshold for the observation of optical gain, where values of $(\Delta OD/OD_0)_{620\,nm}$<−1 imply that the negative features in the nonlinear spectrum (i.e. SE) at 620 nm, c.f. SE 135 in third curve 130 of FIG. 1. These transients display the competition of state filling due to intraband relaxation with the dynamic PA resulting from state-specific multiexcitonic interactions and surface trapping. As such, extracting reliable quantitative information from these transients is challenging. However, qualitatively it is apparent that excitation into the $1P_e$-$1P_{3/2}$ state as shown in second curve 220 requires the influence of state filling to first overcome the PA before achieving the regime of optical gain. This is evident in both the positive going signal at early times (0-100 ps) for the low fluence data, as well as the large induction times associated with the intermediate fluence pumping. The PA first saturates and then recedes as the $1P_e$-$1P_{3/2}$ pump fluence is increased. In contrast, these features are entirely absent when exciting the $1S_e$-$1S_{3/2}$ transition as shown in first graph 210. This is due to the negligible binding energy of the $1S_e$-$1S_{3/2}$+$1S_e$-$1S_{3/2}$ biexciton and the absence of relaxation in the conduction band which imply the absence of high energy valence states resulting in minimal surface trapping on this timescale. Clearly, the state dependent influence of the PA manifests itself as a state dependent development of optical gain as shown in first curve 210 and second curve 220.

Figure 3:
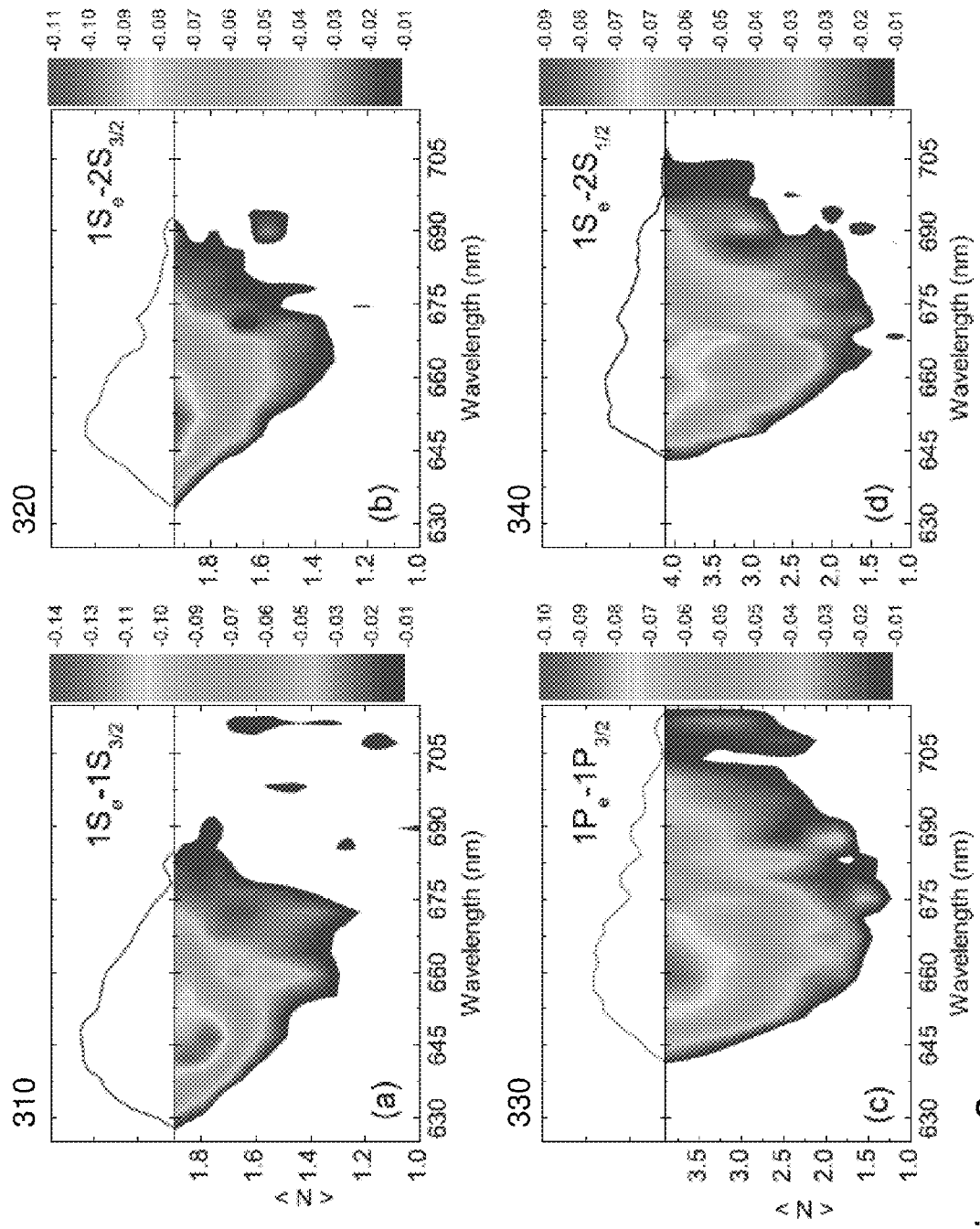
FIG. 3 depicts the non-linear spectra as function of occupancy for 2.8 nm colloidal cadmium selenide/zinc sulphur (CdSe/ZnS) quantum dots for resonant excitation of S and P electron transitions.

Now referring to FIG. 3 there are shown first through fourth contour plots 310 to 340 respectfully that present the occupancy dependent SE spectra for CdSe/ZnS quantum dots, $\lambda_{1S}=619$ nm of R=2.8 nm dispersed in toluene, at 1 ps after resonant excitation of the $1S_e$-$1S_{3/2}$, $1S_e$-$2S_{3/2}$, $1P_e$-$1P_{3/2}$, $1S_e$-$2S_{1/2}$ transitions, as denoted in the upper right corner of each contour plot. Surface passivation of the CdSe quantum dot with ZnS was used in order to minimize the depletion of charge carriers to extrinsic surface-type states, which may have a significant influence even on the 1 ps timescale of these measurements. The upper panels of each of first through fourth contour plots 310 to 340 respectively show the negative portion of the nonlinear spectra (i.e., the SE spectrum) for each state specific pump measured at the maximum occupancy. The negative portions of the nonlinear spectra are plotted in the lower panels of each of first through fourth contour plots 310 to 340 respectfully as a function of occupancy, $\langle N \rangle$. These have been scaled to the band-edge absorption cross-section, i.e. $\sigma_{1S}(619 \text{ nm})=2.099\times 10^{-16}$ cm$^2$, (i.e. $OD_{1S}=1$) so that their magnitudes represent the spectrally resolved nonlinear cross-section, $-\sigma_{NL}(\lambda)$, relative to this value [i.e. $-\sigma_{NL}(\lambda)/\sigma_{1S}$]. The manner in which $\langle N \rangle$ is determined is discussed by J. Sewall et al (see supra for reference). It should be noted that the same general state-dependent phenomena for organically passivated colloidal CdSe quantum dots $\lambda_{1SCdSe}=619$ nm and R=2.8 nm are reproduced for CdSe/ZnS particles with the same band-edge transition energy $\lambda_{1SCdSe/ZnS}=619$ nm. As is evident in FIG. 3 the initially prescribed excitonic state has a pronounced influence on the optical gain spectrum.

Following excitation of the band-edge transition $1S_e$-$1S_{3/2}$ at 619 nm, the maximum of the measured SE spectrum as shown in first contour plot 310 is at 648 nm. When exciting the particle at 510 nm, resonant with the $1S_e$-$2S_{1/2}$ transition, then the SE maximum red shifts as shown in fourth contour plot 340 to approximately 659 nm. In general, as the excitonic energy is increased then the SE spectrum progressively red shifts further. The mechanisms underlying this progressive red shifting are discussed in the section Gain Tailoring subsequently.

Figures 4A, 4B:
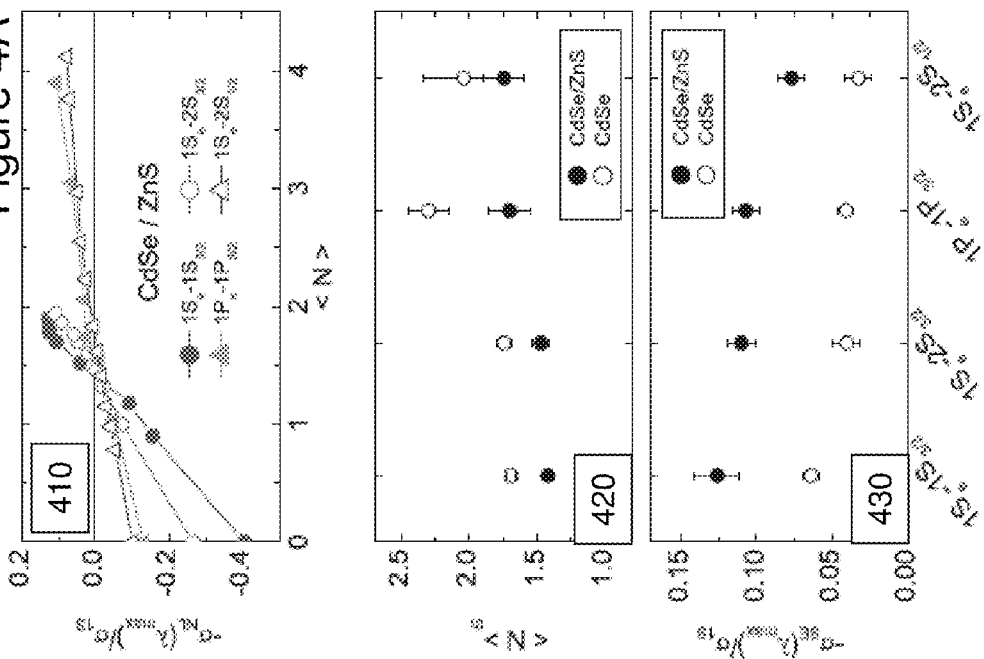
FIG. 4A depicts the occupancy and initial state dependence of the non-linear cross section of 2.8 nm CdSe/ZnS quantum dots for different S and P electron transitions.
FIG. 4B depicts the influence of initial excitonic state on occupancy and maximum spontaneous emission cross section for different S and P electron transitions.

From the first through fourth contour plots 310 to 340 of FIG. 3 the differential gain, $-d\sigma_{NL}/d\langle N \rangle$, can be obtained which is plotted relative to the band edge absorption cross section at the maximum of the SE spectra for each state-specific pump, $-\sigma_{NL}(\lambda_{MAX})/\sigma_{1S}$ as graph 410 in FIG. 4A. The threshold for the development of optical gain is reached when $-\sigma_{NL}(\lambda_{MAX})/\sigma_{1S}>0$. Specifically, negative values for $\sigma_{NL}$ are synonymous with negative signals in the associated nonlinear spectrum and imply the presence of optical gain. The progressive decrease in the ratio $-\sigma_{NL}(\lambda_{MAX})/\sigma_{1S}$ at $\langle N \rangle=0$ reflects the red shifting in the maximum of the SE spectra into regions with less linear optical density when pumping the higher lying excitons. It is evident from FIG. 4A that the differential gain is a strong function of the initially pumped excitonic state, with a general decrease in magnitude as the excitonic energy is increased. The state dependence for the development of optical gain in colloidal CdSe quantum dots is further summarized in first and second graphs 410 and 420 of FIG. 4B. First graph 410 plots the gain threshold $\langle N \rangle_{TH}$ for each initial excitonic state for both CdSe and CdSe/ZnS quantum dots, whilst second graph 420 plots the normalized SE cross-section at maximum emission $(-\sigma_{SE}(\lambda_{MAX})/\sigma_{1S})$ similarly for these two quantum dot types and the initial excitonic state. In addition to the state dependence of the differential gain, both the gain threshold $\langle N \rangle_{TH}$ and the maximum measured nonlinear cross section, $-\sigma_{SE}$, can be seen to be strong functions of the initial excitonic state. As shown in first graph 410 of FIG. 4B there is a general increase in the threshold occupancy as the energy of the exciton is increased, rising from $\langle N \rangle_{TH} \approx 1.42$ when pumping the band-edge $1S_e$-$2S_{3/2}$ exciton at $\lambda_{pump}=619$ nm to $\langle N \rangle_{TH} \approx 1.75$ when exciting the $1S_e$-$2S_{1/2}$ transition at $\lambda_{pump}=510$ nm. In tandem with this observation it can be seen in second graph 420 of FIG. 4B that there a general decrease in the SE cross section associated with higher energy excitons ranging from $-\sigma_{NL}(\lambda_{MAX})\sigma_{1S}\approx 0.13$ when pumping at 619 nm for the $1S_e$-$2S_{3/2}$ exciton compared to $-\sigma_{NL}(v_{MAX})\sigma_{1S}\approx 0.08$ when pumping at 510 nm for the $1S_e$-$2S_{1/2}$ exciton. These results reflect both the larger binding energies and the faster rates of surface trapping associated with higher energy excitons.

The data presented in FIGS. 2, 3, 4A and 4B clearly indicate that the capacity of colloidal CdSe quantum dots to develop optical gain is strongly state dependent, and is a direct manifestation of the state-dependent phenomena associated with the transient dynamics of the interfering PA. The progressively larger binding energies and faster rates of surface trapping associated with the high energy excitonic charge distributions effectively suppress the development of optical gain. Further as the excitonic energy is increased these impeding influences eventually overwhelm the development of optical gain, resulting in the prior art observations of no optical gain below a specific quantum dot dimension when uncapped CdSe colloidal quantum dots were pumped at 400 nm However, it should be noted that the surface passivation of ZnS in the CdSe/ZnS quantum dots results in a general improvement of occupation thresholds and SE cross sections relative to uncapped (non-passivated) quantum dot systems, see FIGS. 4A and 4B. The occupation threshold decreases from ~1.65 for band-edge excitation of uncapped CdSe particles to ~1.42 for the CdSe/ZnS capped particles, with an increase in $-\sigma_{NL}(\lambda_{MAX})/\sigma_{1S}$ from 0.06 to 0.13. This demonstrates not only the importance of specifying the multiexcitonic interactions that optimize the resulting optical gain, but also the influence of surface quality on this optical gain even on picosecond timescales.

Universal Optical Gain in Semiconductor Quantum Dots: Though spherical confinement partitions the bulk electronic structure of CdSe quantum dots into discrete transitions whose energy levels are dependent on the degree of confinement, the general characteristics, e.g., angular momentum, degeneracy etc, of a particular quantized state are independent of particle size. As such, it has been predicted that the occupation thresholds, $\langle N \rangle_{TH}$, necessary to develop optical gain, as well as the build up of population inversions in terms of state filling, should also be entirely independent of particle size, see for example V. I. Klimov (see supra for references). However, as is evident from the prior art and the significant research and development expended in the development and characterization of alternative quantum dot materials, quantum dot passivation materials, and host media such a size-dependent optical gain in colloidal CdSe quantum dot has not been achieved.

Rather, the prior art has shown that exciting colloidal quantum dot systems at 400 nm does not exhibit optical gain for quantum dots with radii smaller than 2.3 nm limiting optical gain from such colloidal quantum dot systems to the red portion of the visible spectrum such that blue, green, yellow, orange regions cannot be accessed with such CdSe quantum dots. However, as is evident from the background presented supra in respect of the invention size-dependent multiexcitonic interactions manifest themselves as an interfering PA suppressing the optical gain. In the foregoing discussion (Influence of Excitonic State on the Development of Gain) it was established that the interfering multiexcitonic interactions and the development of optical gain in colloidal CdSe quantum dots are dependent on the state of the optically prescribed excitons. In general, lower energy excitons were associated with smaller biexcitonic binding energies and slower surface trapping rates, which minimize the influence of the interfering PA. Based on the state-resolved transient dynamics of this PA, it was anticipated that band-edge excitation would result in minimal binding energies, and surface trapping on the 1 ps timescale. As such, referring to FIGS. 4A and 4B it was evident that optically pumping the $1S_e$-$1S_{3/2}$ exciton optimized the occupation threshold, $\langle N \rangle_{Th}$, and SE cross section, $\sigma_{SE}$, simultaneously when compared to the higher energy initial states.

Figure 5A:
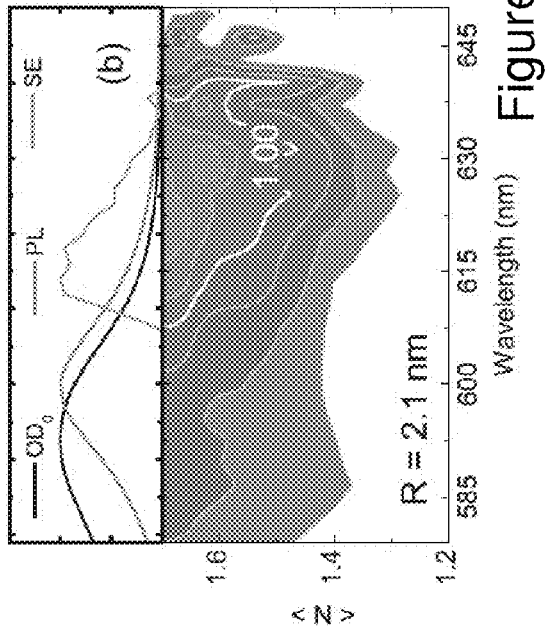
FIGS. 5A through 5C show the spectrally resolved absorption bleaching as function of number of excitations per particle for three different CdSe quantum dot dimensions (2.8 nm, 2.1 nm, and 1.4 nm)
Figure 5B:
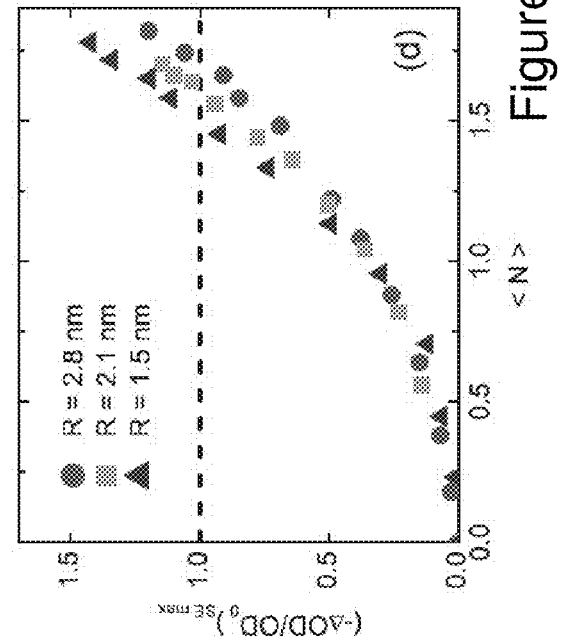
Figure 5C:
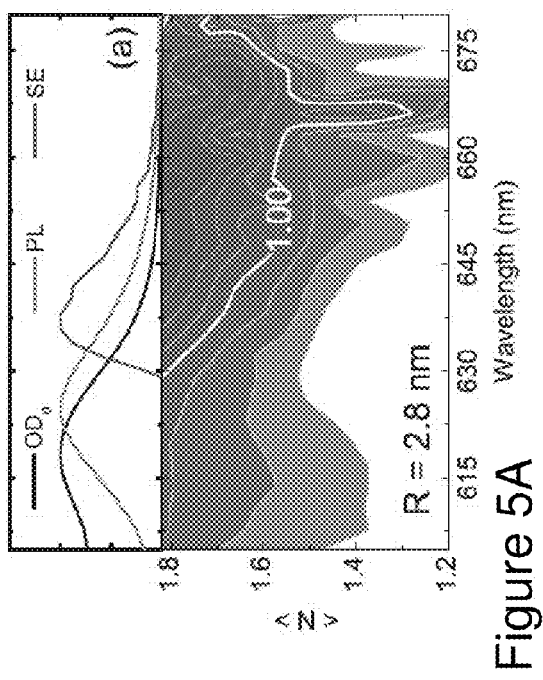

Now referring to FIGS. 5A through 5C there are presented spectrally resolved saturation contour plots for three different sizes of colloidal CdSe quantum dots, R=2.8, 2.1, and 1.5 nm respectively in FIGS. 5A through 5C. The CdSe quantum dots being dispersed in toluene and characterised 1 ps after resonant excitation of the $1S_e$-$1S_{3/2}$ transition. Within each of FIG. 5A through 5C the upper panel plots the measured linear absorption ($OD_0$), spontaneous PL, and the negative portion of the nonlinear spectra (SE) for each size dispersion. The negative portion of the non-linear spectrum corresponds to the SE spectrum, which is red shifted with respect to the PL due to the well-known biexciton interaction, which arises as a result of the intrinsic substructure of the neutral biexciton. The spectrally resolved saturation contour plots within the lower panels of FIGS. 5A through 5C are plotted in terms of the normalized fractional bleaching, $-\Delta OD/OD_0$, and are plotted as a function of wavelength and the average number of excitations per particle in the photoexcited ensemble, $\langle N \rangle$. When $-\Delta OD/OD_0$ is greater than unity it corresponds to negative signals in the nonlinear spectrum, which imply the presence of SE. Here contour plots were used to focus on the spectral content of the measured SE. It is clear that in all cases optical gain is achieved, even in the smallest colloidal particles. This being the first time that optical gain has been demonstrated in CdSe quantum dots at radii of 2.1 nm and 1.5 nm as these are below the previously reported threshold of 2.3 nm in the prior art.

Figure 5D:
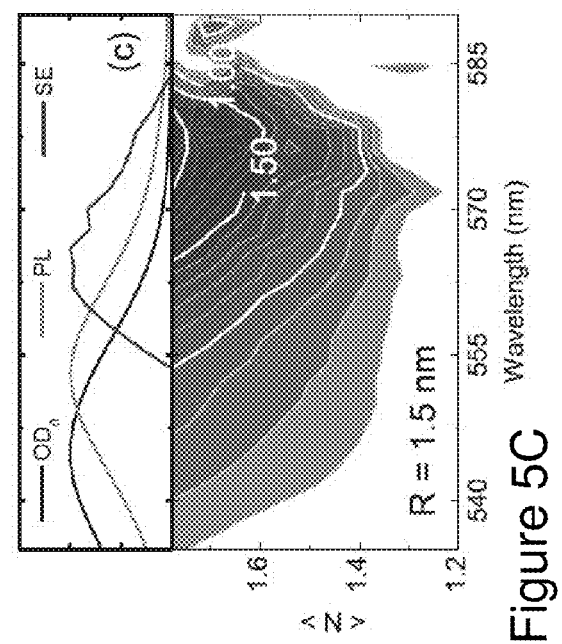
FIG. 5D depicts the differential gain and occupation thresholds for the three different CdSe quantum dots demonstrating near-universal behavior of spontaneous emission spectrum.

Minimizing the influence of the interfering PA by exciting the band-edge transition demonstrates that the development of optical gain in colloidal CdSe quantum dots can be achieved across the key region of confinement induced spectral tuning. This is in contrast with the prior art with 400 nm excitation where attempts to achieve gain in colloidal particles smaller than R=2.3 nm failed, even when using more favourable solvent conditions, i.e. hexane. The data of FIGS. 5A through 5C show that $\langle N \rangle_{Th}$ as well as $(-\Delta OD/OD_0)_{MAX}$ varies across the SE spectrum. Further these results are most ideal at the red edge of the SE spectrum, where there is minimal absorption. Referring to FIG. 5D the universal development of optical gain in these colloidal quantum dot systems is presented by plotting the gain saturation at the peak of the SE spectrum for each size against occupancy $\langle N \rangle$. Clearly from FIG. 5D, the occupancy threshold, $\langle N \rangle_{Th} \approx 1.5$-$1.7$, the maximum measurable fractional bleaching, $(-\Delta OD/OD_0)_{MAX} \approx 1.2$-$1.4$, and the development of optical gain, $d(-\Delta DO/OD_0)/d\langle N \rangle \approx 0.7$, are essentially independent of particle size on the 1 ps timescale. As is evident in FIG. 5D excitation of the band-edge transition recovers the predicted universal and size independent capacity of these spherically confined systems to develop optical gain and is achieved by minimizing the influence of the interfering PA as was outlined in the preceding section, Influence of Excitonic State on the Development of Gain. The small but systematic deviation from universality seen in FIG. 5D may be attributed to thermal occupation and the size-dependent splitting of the band-edge fine structure states, as well as contributions from the confinement enhanced $1S_e$-$1S_{3/2}$+$1S_e$-$1S_{3/2}$ biexcitonic binding energy, and size dependent surface trapping, which are likely still significant even on a 1 ps timescale.

Additionally, the probe pulses used in the investigations of resonant pumping for specific excitonic transitions were derived from single filament white light continuum generated in a sapphire crystal. The spectral limitations of these probe pulses do not allow for the confirmation of the universal development of optical gain in particle sizes, which emit in the blue spectral region. Particles which emit in this spectral region may potentially depart from the universality seen in FIG. 5D due to the impeding size-dependent influence of multiexcitonic interactions, surface trapping, and Auger recombination.

Figure 6:
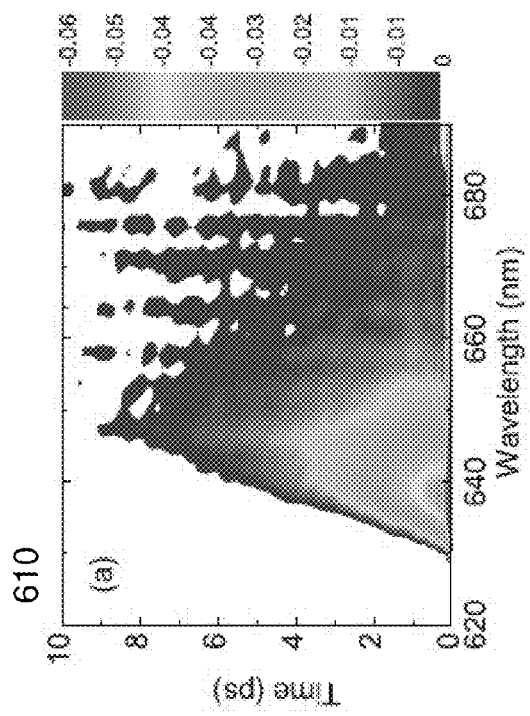
FIG. 6 depicts the non-linear spectrum of 2.8 nm CdSe and CdSe/ZnS quantum dots as a function of time.
Figure 6:
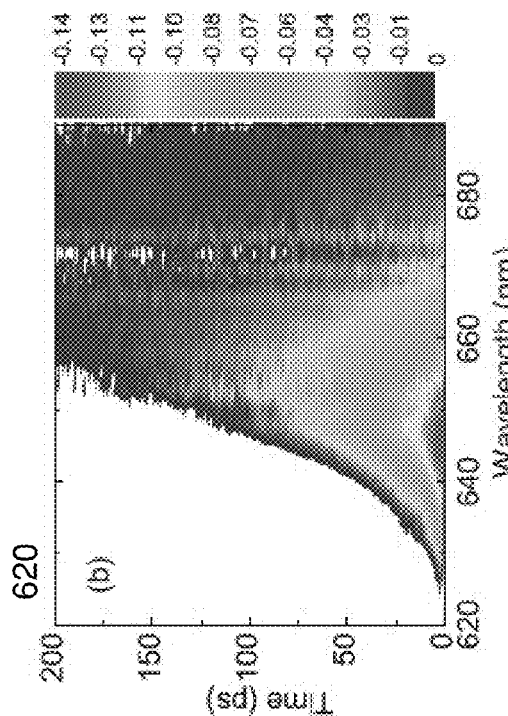

Whilst the preceding analysis and results according to embodiments of the invention have shown that the development of optical gain in colloidal CdSe quantum dots is essentially size independent with band-edge pumping, and that the prior art size limitations have been overcome, it is anticipated that the ability of a quantum dot/host media system to maintain the regime of optical gain will be influenced by extrinsic effects, including for example the depletion of charge carriers to surface states that may be related to particle size, and size-dependent multi-carrier recombination. Referring to FIGS. 6A and 6B the temporal evolution of the negative portion of the nonlinear spectrum ($OD_{NL}$) is plotted for two different colloidal dot material systems within the same host media, toluene, following high fluence band-edge excitation. FIG. 6A plots the results for the SE lifetime of CdSe quantum dots with $\lambda_{1S}$=619 nm and R=2.8 nm, whilst FIG. 6B plots the results for CdSe/ZnS quantum dots with $\lambda_{1S}$=619 nm and R=2.8 nm.

In each of FIGS. 6A and 6B the $OD_{NL}$ has been normalized at $OD_{1S}$=1. Referring first to FIG. 6A the SE signal for the CdSe quantum dots persists for approximately 8 ps, with a 1/e time of approximately 3.2 ps. In contrast, referring to FIG. 6B, the CdSe/ZnS quantum dots of same physical dimension yield SE persisting for ~200 ps with a 1/e of 60 ps, nearly 20 times that of the uncoated CdSe quantum dots. Hence from FIGS. 6A and 6B it can be ascertained that the lifetime of the observed optical gain can be limited by the rate of surface trapping or by the rate of Auger recombination, depending on pumping conditions and the material system. The shorter lifetime for the uncapped particles is consistent with prior art results (as R=2.8 nm is above the previously considered threshold for achieving optical gain) and is likely due to surface trapping processes rather than multi-carrier recombination. The 60 ps SE 1/e lifetime for CdSe/ZnS quantum dots is consistent with the expected biexcitonic recombination times suggesting that the influence of surface trapping for the duration of the gain lifetime has been removed. The consistency of biexcitonic Auger recombination times with the gain lifetime observed for the CdSe/ZnS system confirms that Auger recombination represents the dominant intrinsic decay mechanism of optical gain in colloidal quantum dots. By minimizing the contributions of surface trapping to the depletion of optical gain, with the ZnS over coating, we recover gain lifetimes limited by the size dependence of multi-carrier recombination, and optimize the metrics such as the occupation threshold and SE cross section as was seen in the preceding section, Influence of Excitonic State on the Development of Gain Gain Tailoring in Semiconductor Quantum Dots: It is known that the spatial localization of excited charge distributions in strongly confined CdSe quantum dots enhances multiexcitonic interactions and that these interactions manifest themselves as a shifting of the quantum dot's zeroth order transition energies. This effect was clearly seen in both the red shifting of the band-edge absorption due to biexcitonic binding that resulted in the PA as demonstrated in the preceding sections in FIGS. 2, 3, 4A and 4B as well as the red shifting of the SE spectra relative to the associated spontaneous PL seen in FIGS. 5A through 5C. In addition, it has been established that resonantly pumping the $1S_e$-$1S_{3/2}$ and $1S_e$-$2S_{3/2}$ transitions in colloidal CdSe quantum dots could at most result in two excitations per particle $\langle N \rangle_{MAX} = 2$, limited by the twofold spin degeneracy of the 1S electronic state. However, the occupancy threshold, $\langle N \rangle_{th}$, for the development of optical gain following band-edge excitation was measured to be 1.65 in FIG. 5D and that $\langle N \rangle_{MAX} = 2$, then it is clear that the measured SE spectra are arising due to transitions involving an emitting state interacting with a biexcitonic charge distribution. In contrast, direct excitation into the $1P_e$-$2P_{3/2}$ and $1S_e$-$2S_{1/2}$ states can support up to eight excitations due to overlapping transitions involving the six fold degenerate $1P_e$ and twofold degenerate $1S_e$ electronic states. This implies that the emitting state involved in the measured SE following excitation of these higher energy transitions may result from perturbations due to a mixture of biexcitonic, triexcitonic, and higher-order charge distributions such that emission from biexcitonic, triexcitonic, and higher-order charge distributions occurs at distinct energies.

Accordingly this mixture of charge distributions in the photoexcited ensemble of colloidal quantum dots should result in a range of distinct energies for the emitting transition. The capacity to control the gain spectrum of colloidal CdSe/ZnS quantum dots $\lambda_{1SCdSe/ZnS} = 619$ nm with R=2.8 nm based on populating specific excitonic states was evident in FIG. 3. Further it was observed in FIG. 3 that there is a general red shifting in the maximum of the SE spectra, $\lambda_{MAX}$, as the exciton energy is increased, as evident from FIGS. 5A through 5C. Following excitation of the band-edge transition $1S_e$-$1S_{3/2}$ at 619 nm, the maximum of the measured SE spectrum is at 648 nm When exciting the particle at 510 nm, resonant with the $1S_e$-$2S_{1/2}$ transition the SE maximum red shifts to approximately 659 nm This effect has also been in the progressive red shifting of the SE spectrum with higher energy excitons for uncapped CdSe particles. If we assume that we removed the influence of surface states on the 1 ps timescale in the CdSe system over coated with ZnS, the endurance of this phenomenon suggests that the observed shifting is due to the interaction of intrinsic quantized charge distributions with the emitting transition.

Figure 7A:
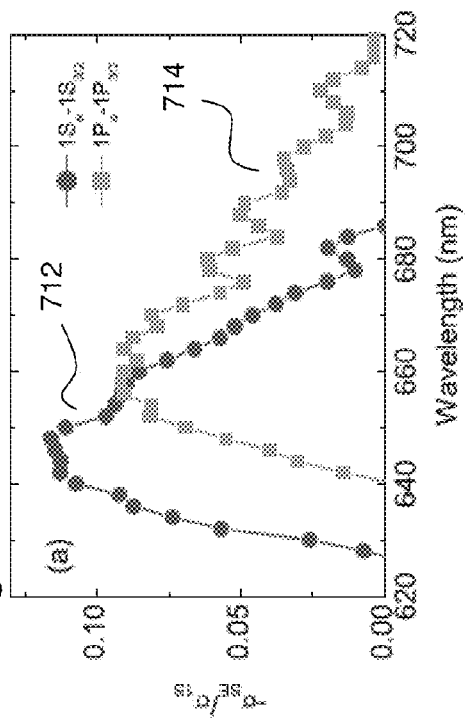
FIG. 7A depicts the spontaneous emission spectra for 2.8 nm CdSe/ZnS quantum dots for specific S and P electronic transitions.

This red shifting of the SE spectrum is most pronounced when pumping higher energy excitons. A comparison of the SE spectra of colloidal CdSe/ZnS quantum dots, measured at maximum occupancy, following excitation of the $1S_e$-$1S_{3/2}$ ($\langle N \rangle = 1.9$) and $1P_e$-$1P_{3/2}$ ($\langle N \rangle = 3.9$) transitions, and normalized to a sample $OD_{1S} = 1$, is shown in FIG. 7A and red shifting of the spectrum is evident. In the case of band-edge $1S_e$-$1S_{3/2}$ first SE spectrum 712, the excitation of the emitting transition is perturbed by only a biexcitonic charge distribution due to limitations imposed by the twofold degenerate 1S conduction state. As such, there will be no quantum dot in the photoexcited ensemble that possesses N>2. Particles with N=0 or N=1 have not achieved population inversion and will only contribute to the SE signal through re-adsorption. In contrast, the second SE spectrum 714 measured following excitation of the $1P_e$-$1P_{3/2}$ transition will have a significant amount of particles in the photoexcited ensemble with N=2 due to their ability to access the greater degeneracy of the P-type states. In general, if $\langle N \rangle$ is the average number of excitations in the ensemble, and we approximate populations resulting from exciting the $1P_e$-$1P_{3/2}$ transition as being Poissonian then the fraction of particles containing N excitations, $P_N$ is given by Equation (1)

$$P_N = \langle N \rangle \frac{N e^{-\langle N \rangle}}{N!} \quad (1)$$

Specifically, for the SE spectrum corresponding to excitation of the $1P_e$-$1P_{3/2}$ transition seen in FIG. 7A, the average number of excitations is $\langle N \rangle = 3.9$. In this case, approximately 75% of the particles will contain N>2 ($P_{N=3} \approx 20\%$, $P_{N=4} \approx 20\%$, $P_{N=5} \approx 10\%$, etc), and the SE spectrum will consist of a sum of shifted transition energies due to interactions with these discrete higher-order charge distributions. This implies that the higher-order charge distributions are progressively red shifting the emitting transition. This effect should also result in enhanced red-edge SE when optically pumping the higher energy excitonic states. The enhanced gain bandwidth when pumping the $1P_e$-$1P_{3/2}$ and $1S_e$-$2S_{1/2}$ states is evident in the large SE signals at the reddest wavelengths ($\lambda_{NL} \sim 680$-700 nm) in FIGS. 3 and 7A. Throughout this spectral range the ratio $-\sigma_{SE}/\sigma_{1S}$ approaches 0.05 (i.e. $\sigma_{SE}(680 \text{ nm}) \approx 1 \times 10^{-17}$ cm$^{-2}$) corresponding to approximately an order of magnitude higher optical density than is available to the linear system (i.e. $(\Delta OD/OD_0)_{680 \text{ nm}} \approx 11$). In contrast, excitation of the band-edge and $1S_e$-$2S_{1/2}$ transitions are completely unable to generate optical gain above the noise levels at these wavelengths. This draws attention to some subtleties in the electronic structure of strongly confined CdSe quantum dots.

The enhanced gain bandwidth is attributable to the capacity of the $1P_e$-$1P_{3/2}$ and $1S_e$-$2S_{1/2}$ excitonic states to contain higher-order charge distributions. This mixture of higher-order charge distributions, which are accessible due to the six fold degenerate $1P_e$ state, results in a mixture of available transition energies for the emitting state due to confinement enhanced multiexcitonic interactions. Specifically, each order of charge distribution (biexcitonic, triexcitonic, etc.) will have a particular energy associated with the emitting transition and the presence of triexcitonic and higher-order excitons in the photoexcited ensemble further red shifts the emitting transition relative to its excitonic and biexcitonic energies. This effect not only results in the progressive red shift of the SE spectrum, but also as a broadening of the SE signal. In contrast, the relatively narrow SE spectra measured following excitation of the two lowest energy transitions ($1S_e$-$1S_{1/2}$, $1S_e$-$1S_{3/2}$) arises primarily due to a single type of charge distribution (i.e. biexcitonic) as limited by the twofold degeneracy of the $1S_e$ state. This ability to selectively access the greater degeneracy of the P-type states allows for the state-dependent control of the resulting optical gain spectrum in these spatially confined particles.

Whilst the embodiment of the invention teaches state-dependent resolved pumping to provide development and control of SE in CdSe and CdSe/ZnS quantum dots, the presence of SE alone in a pump/probe experiment does not guarantee that ASE will be observed. Firstly, the number density of the excited particles should be large enough to allow spontaneous emission to be amplified within the SE lifetime, and secondly the capacity to tailor the gain spectrum via higher-order excitonic distributions will only influence the ASE if the particles are able to maintain these charge distributions on a timescale comparable to the gain lifetime. This may present a limitation in the observed spectral control in some instances, as the higher-order charge distributions resulting from $1P_e$-$1P_{3/2}$ and $1S_e$-$2S_{1/2}$ excitation are characterized, in the case of CdSe, by progressively faster Auger mediated multiexcitonic recombinations than the biexcitonic distributions induced by exciting of the $1S_e$-$1S_{3/2}$ and $1S_e$-$2S_{3/2}$ transitions.

Referring to FIGS. 8A through 8C results for measurements of ASE in drop cast films of CdSe/ZnS quantum dots with $\lambda_{1S}$=624 nm and R=2.9 nm. The CdSe core with ZnS shell was used due to its longer SE emission, see discussion in respect of FIGS. 6A and 6B, and a close-packed film via drop casting was rather than a colloidal configuration due to its high number density. FIG. 8A depicts the development of the sharp ASE peaks within the PL spectrum under conditions of pumping the $1S_e$-$2S_{3/2}$ ($\lambda_{PUMP}$=600 nm) and $1S_e$-$2S_{1/2}$ ($\lambda_{PUMP}$=500 nm) transitions. As is evident in FIG. 8A optically exciting the $1S_e$-$2S_{1/2}$ transition, which can access the greater degeneracy of the P-type states, significantly red shifts the observed ASE peak relative to excitation of the $1S_e$-$2S_{3/2}$ transition. Excitation of the $1S_e$-$2S_{3/2}$ transition ($\lambda_{pump}$=600 nm) with a pump energy of $J_{pump}$=6.57 mJ/cm² results in the peak ASE occurring at $\lambda_{ASE}$=649 nm as shown by first curve 810. By comparison excitation of the $1S_e$-$2S_{1/2}$ transition ($\lambda_{pump}$=500 nm) with a pump energy of $J_{pump}$=7.10 mJ/cm² results in the peak ASE occurring at $\lambda_{ASE}$=654 nm as shown by second curve 820.

This red shifting of 5 nm is entirely consistent with the state-resolved pump/probe measurements presented above in respect of FIGS. 3 and 7, though the red shifting resulting from the higher energy exciton is less pronounced in the ASE measurement. Referring to FIG. 8B the pump fluence dependence of these peaks is shown and clearly depicts the threshold behaviour of the ASE. One possible explanation for the observed red shifting of the ASE when exciting with the higher energy $1P_e$-type pump relative to the $1S_e$-type pump is merely due to heating. Based on the known temperature dependence of the PL the 15 meV energy shift seen in FIG. 8A would correspond to heating of 160K, thereby removing this as a cause of the red shift. A second possible explanation is that that the drop-cast film was more strongly heated with the $1P_e$ pump then the spontaneous PL would also shift but there is negligible spectral shifting of the PL under any fluence for any pumping wavelength. Similarly, the ASE spike does not significantly move relative to the observed 15 meV shift based on fluence. If the ASE motion was due to heating, the ASE spike would increasingly red shift for higher fluences, even when using the same pump wavelength. In fact, the ASE spike with 1Pe pump at the lowest fluences is at the same red shifted position with respect to the ASE spike with 1Se pump at the highest fluences. Since neither the spontaneous PL nor the ASE signals display a significant red shift based on fluence, we can rule out heating as the origin of the red shifted ASE for the $1P_e$ pump. Rather, the observed shift in ASE wavelength is ascribed to the ability of the higher energy pump to access higher order charge distributions through the greater degeneracy of the P-type states. In contrast, excitation at 600 nm, resonant with the $1S_e$-$2S_{3/2}$ transition, can at most result in two excitations as limited by the degeneracy of the 1S electronic state. From the pump/probe measurements of FIG. 3 as the order of the charge distribution is increased the emitting transition is progressively and discretely red shifted. In the case of the $1P_e$ pump we would anticipate that increasing pump fluence would result in an increased fraction of higher-order charge distributions contributing to the signal. Like heating, this should also result in a progressive red shift in the ASE spike with pump fluence. However, as was previously mentioned, spectral shifting of the ASE spike with pump fluence is negligible.

Referring to the prior art of V. I. Klimov, see supra for reference, the quantization of multiexcitonic Auger mediated recombination shows that progressively higher-order distributions are characterized by progressively smaller lifetimes. As such as the order of the charge distributions is increased they should have significantly less influence on the time-integrated ASE measurement. Specifically, the ratio of lifetimes for the four-pair state, $\tau_4$, the triexcitonic state, $\tau_3$, and the biexcitonic state, $\tau_2$, was shown to be $\tau_4$, $\tau_3$, $\tau_2$=0.22: 0.47:1 for CdSe quantum dots. The anticipated lifetime of the triexcitonic state for this size of particle is approximately $\tau_3 \approx 30$ ps, allowing it to significantly contribute to the ASE wavelength within the gain lifetime ($\tau_2 \approx T_{SE} \approx 60$ ps) of the CdSe/ZnS particles. However, as the excitation order is increased it will become increasingly difficult for the particles to maintain these higher order charge distributions on relevant timescales. Considering that negligible shifting is observed in the ASE spike for the $1P_e$-type pump with increasing fluence, we assign the observed 15 meV red shift relative to the $1S_e$-type pump principally to triexcitonic charge distributions contributing to perturbations of the emitting transition.

Figure 7B:
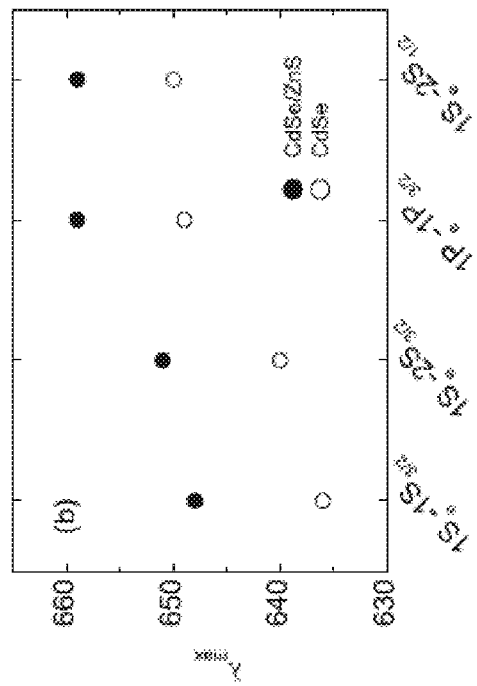
FIG. 7B depicts the influence on initial excitonic state in maximum emission wavelength of the spontaneous emission spectra.

This assignment also explains the reduced red shift seen in the ASE measurements (15 meV) of FIG. 8A relative to the pump/probe experiments (23 meV) as shown in FIG. 7B. The pump/probe measurements are taken precisely 1 ps following state-resolved excitation. The particles are able to maintain higher-order charge distributions on this timescale, which, as expected, results in the larger red shift observed for the emitting transition. The ability of higher-order excitonic distributions to further red shift the energy of the emitting transition relative to a biexcitonic distribution is clearly observed in the state-resolved SE spectra of FIG. 3, as well as the state-resolved ASE measurements of FIG. 8.

Further to demonstrate the benefits of optically prescribing specific multiexcitonic interactions in these spatially confined systems is the ASE measurement in FIG. 8C. This measurement is an extension of the ASE results of FIG. 8A, but is the result of the maximum $1S_e$-$2S_{3/2}$ at pump fluence of $J_{pump}$=35.8 mJ/cm² (which is approximately five times larger than the maximum fluence used in FIG. 8A). In this case the steady state PL is entirely overwhelmed by the magnitude of the ASE, which is more than an order of magnitude larger than the largest intensities shown in FIG. 8A. The full fluence dependence of the ASE following excitation of the $1S_e$-$2S_{3/2}$ transition is presented in the inset within FIG. 8C.

Summary: In the discussions and analysis presented supra in respect of FIGS. 1 through 8C the limitation within the prior art of optical gain only being achievable within quantum dots which are above a defined size limit has been overcome. The theoretical prediction of optical gain being a universal feature of strongly confined quantum dots has been verified by the embodiments of the invention, namely a state-resolved optical pumping scheme that selectively manipulates the multiple interfering multiexcitonic interactions within the quantum dot to provide occupation thresholds and differential gains that are essentially quantum dot size independent in these promising materials.

Minimization of the interference from multiexcitonic interactions and surface trapping was obtained by resonant excitation of the band-edge transition resulting in efficient development of optical gain in all CdSe quantum dots in solution, including optical gain in quantum dots below the previous considered threshold limit of 2.3 nm from the prior art allowing optical emission within the amber, yellow and green regions of the visible spectrum. Beneficially over coating strongly confined CdSe quantum dots with ZnS, known to improve surface quality by reducing the influence of surface trapping, was shown to improve the measured thresholds and cross sections relative to organically passivated systems. Also, inhibiting the influence of surface trapping was shown to increase the gain lifetime by a factor of 20. The measured lifetimes for CdSe/ZnS quantum dots were consistent with the decay rates expected from biexcitonic Auger recombination. This confirmed that non-radiative Auger recombination represents the intrinsic mechanism limiting the gain lifetime of these semiconductor materials.

The embodiments of the invention resonant excitation allow specific initial excitonic states to be populated giving the ability to control the gain spectra of strongly confined materials via these tailored multiexcitonic interactions. The confinement enhanced interactions generated by the resonant excitation are dependent not only on the identity of the excitonic state but also on the order of the multiexcitonic distribution as mediated by the degeneracy of the states involved. Resonant excitation of higher order charge distributions results in an increased red shift of the emitting transition in strongly confined CdSe and CdSe/ZnS quantum dots, resulting in the enhanced bandwidth and control of the optical gain spectra.

Device Embodiments: The embodiments of the invention described above relate to the resonant excitation of quantum dots to generate specific initial excitonic states within the quantum dots allowing optical gain to be achieved at all dimensions of quantum dot allowing a blended dimension colloidal quantum dot structure in combination with optical pump sources to provide the necessary emission for the application. For efficient pumping of the quantum dots it is necessary to provide them in combination with high efficiency optical sources. Within the prior art colloidal quantum dots with dimensions above 2.3 nm are pumped at $\lambda_{pump}$=400 nm resulting in an optical source providing broadband emission limited to the longer wavelength amber/red portion of the visible spectrum. Accordingly a single InGaN LED source may be employed for example.

However, according to the embodiments of the invention the resonant state controlled pumping of the quantum dots not only enables quantum dot emissions within the green-yellow portion of the spectrum for dots with dimensions between 1.5 nm and 2.3 nm but would enable blue emission for quantum dots below 1.5 nm. However, the results and analysis presented supra show that each different quantum dot dimension requires a different optical source to resonantly pump them. As such to generate a high efficiency white light source using for example 4 quantum dot dimensions, e.g. R=1.0, 1.5, 2.0, 2.5 nm it would be necessary to provide 4 emitters to resonantly excite these with high efficiency. Further if the emission overlap between a pair of adjacent quantum dot dimensions then it may be necessary to also provide a resonant excitation to a higher excitonic state for part of the population of one dot dimension as these higher excited quantum dots would emit red shifted relative to the same dots excited at their fundamental excitation.

As evident from the results presented supra in respect of FIGS. 1A through 8C these excitation wavelengths lay across the spectrum such that the ability to integrate multiple high efficiency optical sources with tailored wavelengths is important. Alternatively multiple discrete devices would be necessary wherein a high efficiency source operates with a specific quantum dot dimension such that these discrete devices are assembled to form the high efficiency white light source. Such an approach may provide the cost effective solution depending upon the yield for monolithic integration. Within the prior art today LED sources are formed from a variety of materials, upon multiple substrates, and operating voltages. Table 1 below shows the semiconductor alloys currently employed

TABLE 1

Semiconductor Alloys for Visible Solid State Light Sources

| Colour | Wavelength (nm) | Voltage (V) | Material |
|---|---|---|---|
| Red | $610 < \lambda < 760$ | $1.63 < \Delta V < 2.03$ | AlGaAs, GaAsP, AlGaInP, GaP |
| Orange | $590 < \lambda < 610$ | $2.03 < \Delta V < 2.10$ | GaAsP, AlGaInP, GaP |
| Yellow | $570 < \lambda < 590$ | $2.10 < \Delta V < 2.18$ | GaAsP, AlGaInP, GaP |
| Green | $500 < \lambda < 570$ | $1.90 < \Delta V < 4.0$ | GaP, AlGaInP, AlGaP |
| Blue | $450 < \lambda < 500$ | $2.48 < \Delta V < 3.7$ | ZnSe, InGaN |
| Violet | $400 < \lambda < 450$ | $2.76 < \Delta V < 4.0$ | InGaN |

With the recent discovery that the bandgap of InN is approximately 0.7 eV (1750 nm) and the bandgap of GaN is approximately 3.3 eV (370 nm) then the quaternary alloy InGaN has become the focus of significant research as it can be continuously tuned from ~0.7 eV to 3.3 eV, matching almost perfectly to the solar spectrum, but importantly for white LEDs the material can provide a single material system for the visible spectrum. Further, it would be beneficial to be able to form nanowires using the material system upon silicon substrates allowing large low cost substrates to be employed and optical sources with high efficiency and allowing efficient coupling from an array of optical emitters with dimensions approximately 50 nm to 100 nm when compared to quantum dots of radii between 1 nm and 3 nm for example.

Within the prior art high quality, uniform, nanowires of InN or GaN have not be grown upon silicon substrates without inclusion of gold arising from foreign metal catalysts. However, Y. Chang et al "Molecular Beam Epitaxial Growth and Characterization of Non-Tapered InN Nanowires on Si(111)" (Nanotechnology, Vol. 20, 2009) and Z. Mi et al in US patent application Ser. No. 12/956,039 entitled "Method of Growing Uniform Semiconductor Nanowires without Foreign Metal Catalyst and Devices Thereof". Referring to FIG. 9A there is shown an exemplary process according to an embodiment of the invention for growing InN nanowires onto silicon (of orientation<111>) substrates using a Veeco Gen II MBE system equipped with a radio frequency (RF) plasma source. The process starts at step 9005 and moves to step 9010 wherein the silicon (Si) wafer is cleaned, in this case by an ex situ clean using standard solvent and buffer hydrofluoric acid solution, before the process moves to step 9015 and the Si wafer is loaded into the MBE chamber. Next, in step 9020, the deposition parameters for the nanowire growth are established, determined by the composition of the nanowire, inclusion of quantum dots, quantum wells, etc as well as physical parameters such as nanowire length. Subsequently in step 9025 an in situ oxide desorption at elevated temperatures (~770° C.) is performed together with a degassing procedure (~850° C. for 10 minutes), the result of which is that a 7×7 reflection high energy electron diffraction (RHEED) pattern can be clearly observed as evident from first insert 9070.

Next in step 9030 the substrate temperature is lowered, typically between 430° C. and 520° C. for the growth of InN nanowires and the indium organometallic precursor or indium beam flux is introduced, i.e. TMIn or In respectively, and the reactor operates for a first predetermined period of time in step 9035 in order to deposit a thin In layer, of thickness typically between 0.5 nm and 1.6 nm (representing typically 10 to 30 seconds of processing). Next in step 9040 the nitrogen precursor, ammonia, is introduced and the process moves to step 9045, wherein the substrate temperature is raised to 480° C. and the process continues to execute for a second predetermined period of time before the process terminates at step 9050. The growth period ranged from 30 minutes to 10 hours within experiments performed.

Additionally, the formation and properties of InN nanowires under different growth conditions have been evaluated. Typical process ranges for InN nanowires include nitrogen flow rates between 1.0 sccm and 2.0 sccm. In partial pressure between Torr, growth temperature between 430° C. and 520° C., and RF plasma forward power between 300 W and 450 W.

Figure 9B:
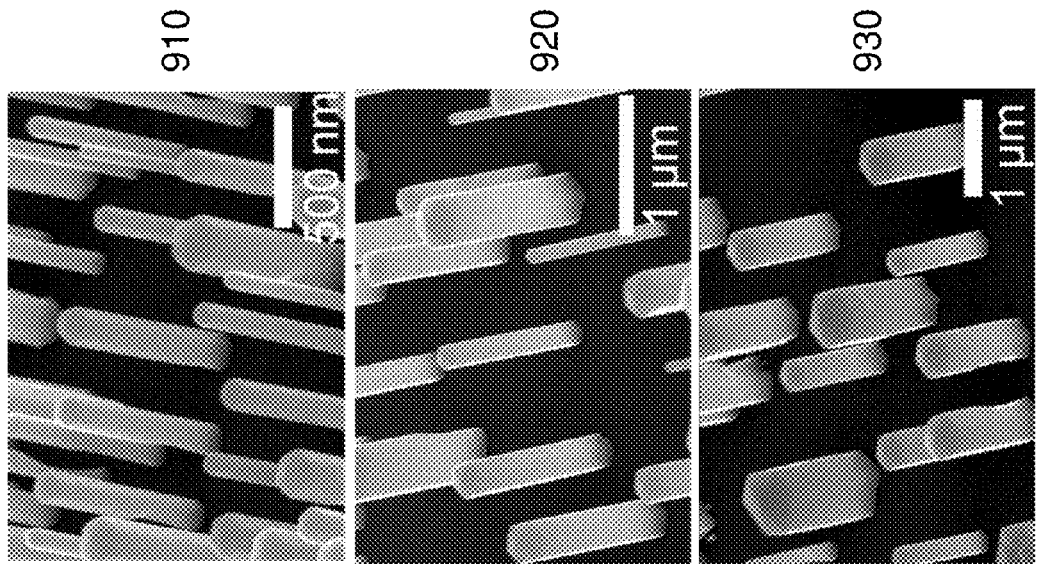
FIG. 9B depicts SEM micrographs of InN nanowires grown according to an embodiment of the invention at varying In fluxes for constant growth temperature.
Figure 9A:
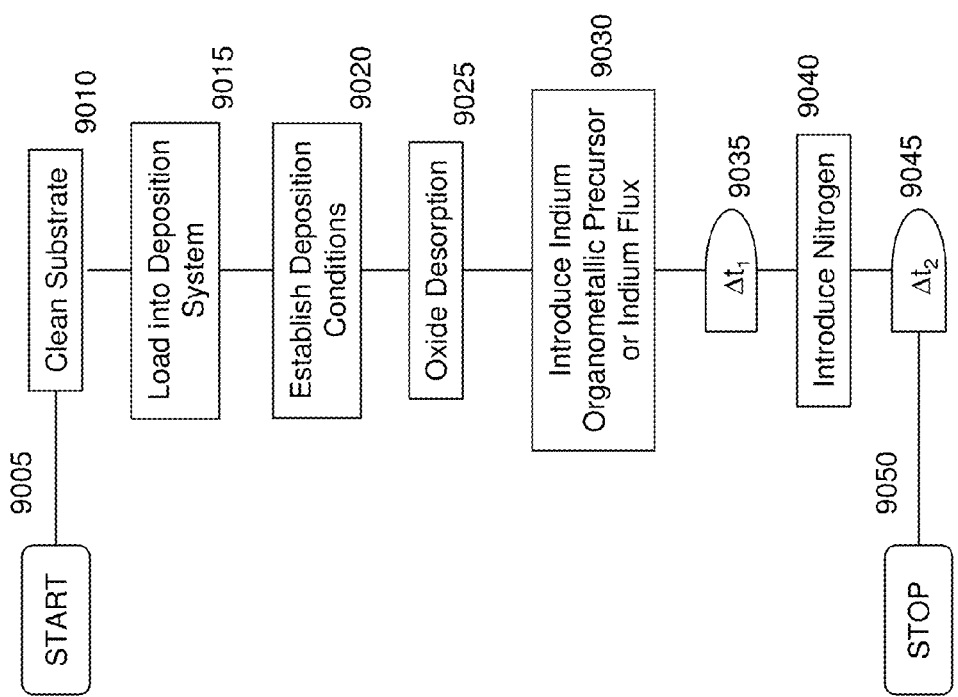
FIG. 9A depicts an exemplary process flow for growing InN nanowires according to an embodiment of the invention.

The effect of In flux on the structural properties of InN Nanowires is shown with reference to FIG. 9B where the growth temperature was fixed at ~470° C., which is sufficiently high to yield well-separated nanowires. First to third SEM image 910 to 930 respectively being SEM images taken at tilt angles of 45° for samples grown at In beam equivalent pressures (BEPs)_of ~2×10−8, ~7×10−8, and ~1.8×10−7 Torr, respectively, which are well within the nitrogen-rich regime. It is observed that the wire diameters increase from ~100 nm to ~250 nm, or larger, with the increase in the In deposition rate, which is attributed to the enhanced In adatom migration and the subsequent incorporation on the wire lateral surfaces. Further increase in the In flux may eventually lead to the formation of compact InN layers. The wire densities are also reduced with the increase in the In deposition rate potentially due to the enhanced coalescence of smaller wires during the initial stage of wire growth when the nitrogen/In flux ratio is reduced. According to embodiments of the invention, with the variation in the In deposition rate, InN nanowires also exhibit completely nontapered morphology, which is in direct contrast to conventionally grown InN nanowires wherein variations in the In flux commonly induce a significant change in the ratio between the top and the bottom wire diameters.

Figure 9C:
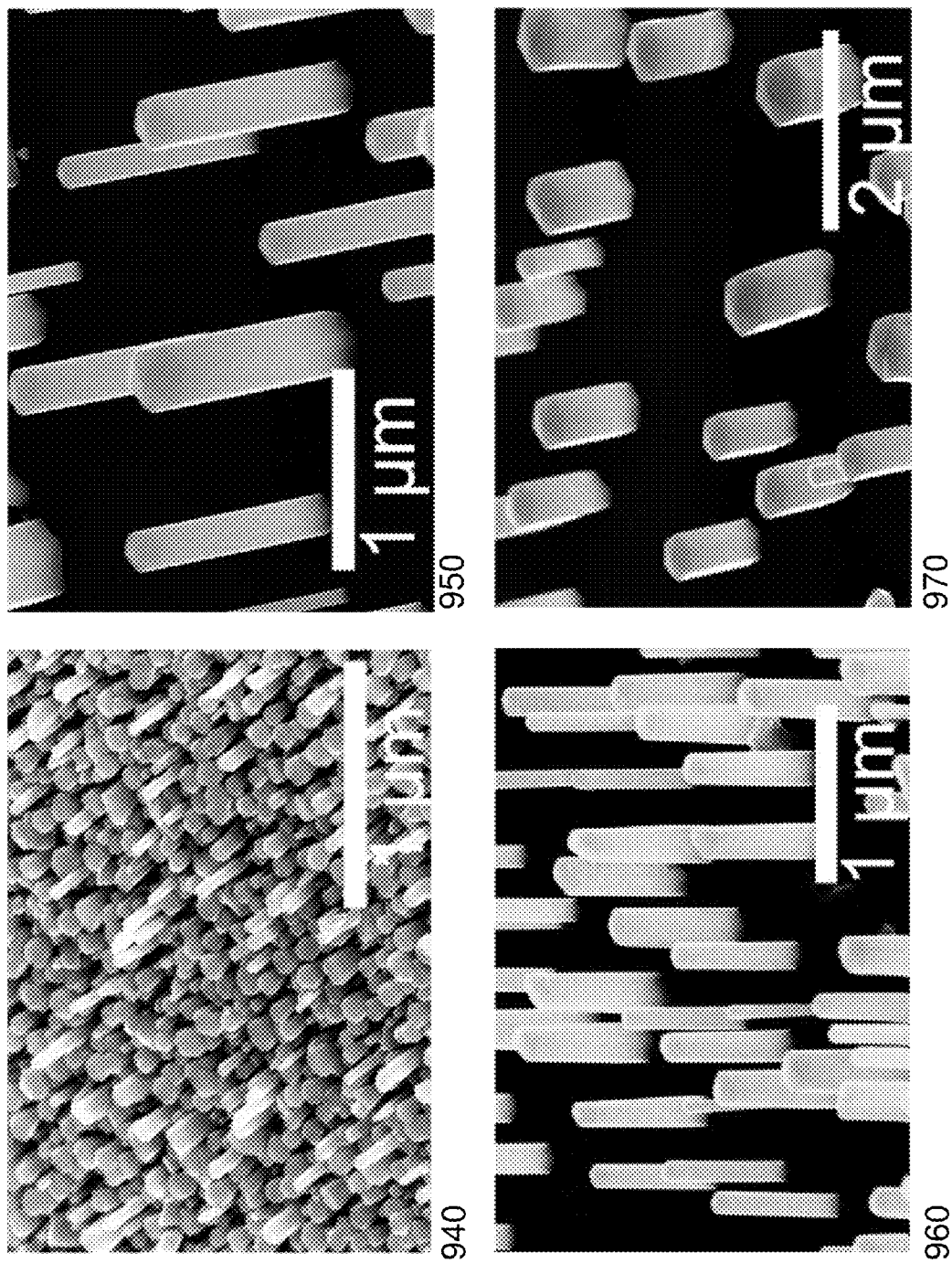
FIG. 9C depicts SEM micrographs of InN nanowires grown according to an embodiment of the invention at varying growth temperature.

Referring to FIG. 9C there are shown first to fourth SEM images 940 to 970 respectively taken at tilt angles of ~45° for samples grown at 440° C., 460° C., 480° C., and 500° C., respectively are shown. The In flux was fixed at 1×10−7 Torr for the four samples, and a 0.5 nm In seeding layer was deposited in situ prior to the growth initiation. It is evident that both the wire density and size vary considerably with the change in the growth temperature. At a relatively low growth temperature (~440° C.), the nanowires are generally coalesced together and exhibit a bimodal distribution in both height and diameter, shown in FIG. 4A. A further reduction in the growth temperature will lead to compact InN layers due to the reduced In thermal desorption. With the increase in the growth temperature, the wires become well spaced, the wire densities decrease considerably from ~100 mm-2 to ~1 mm-2, and the wire diameters increase from ~50 nm to ~200 nm, or larger in the temperature range of 440-500° C. The wire density and size are determined, to a large degree, by both the nucleation sites as well as the subsequent thermal-driven convalescence process during the initial stage of the wire formation. The properties of the nucleation sites, or In islands, are also strongly temperature dependent. At elevated substrate temperatures, conventional InN nanowires generally exhibit a severe enlargement of diameter toward the top due to a very high In migration rate. In contrast, InN nanowires grown at high temperatures ~460-500° C. according to embodiments of the invention are well faceted and highly homogeneous in height and, more importantly, exhibit completely suppressed tapering or broadening effect along the entire wire length, as shown in first to fourth SEM images 940 to 970 respectively.

It can be seen that these wires are remarkably straight, with identical top and bottom sizes. They also exhibit homogeneous height. The wires are of wurtzite structure and well-separated, with the c-axis oriented vertically to the Si(111) substrate as commonly observed for III-nitride nanowires grown on Si(111), see for example C. Shen et al (Appl. Phys. Lett., Vol. 88, 2006) and Y. Lu et al (Appl. Phys. Lett., Vol. 91, 2007). For comparison, conventional InN nanowires grown at such temperatures generally exhibit an inverse pyramid-like shape, with the wire top 2-5 times larger than the root; see for example T. Stoica et al in "MBE Growth Optimization of InN Nanowires" (J. Crystal Growth, Vol. 290, pp. 241, 2006).

Figure 9D:
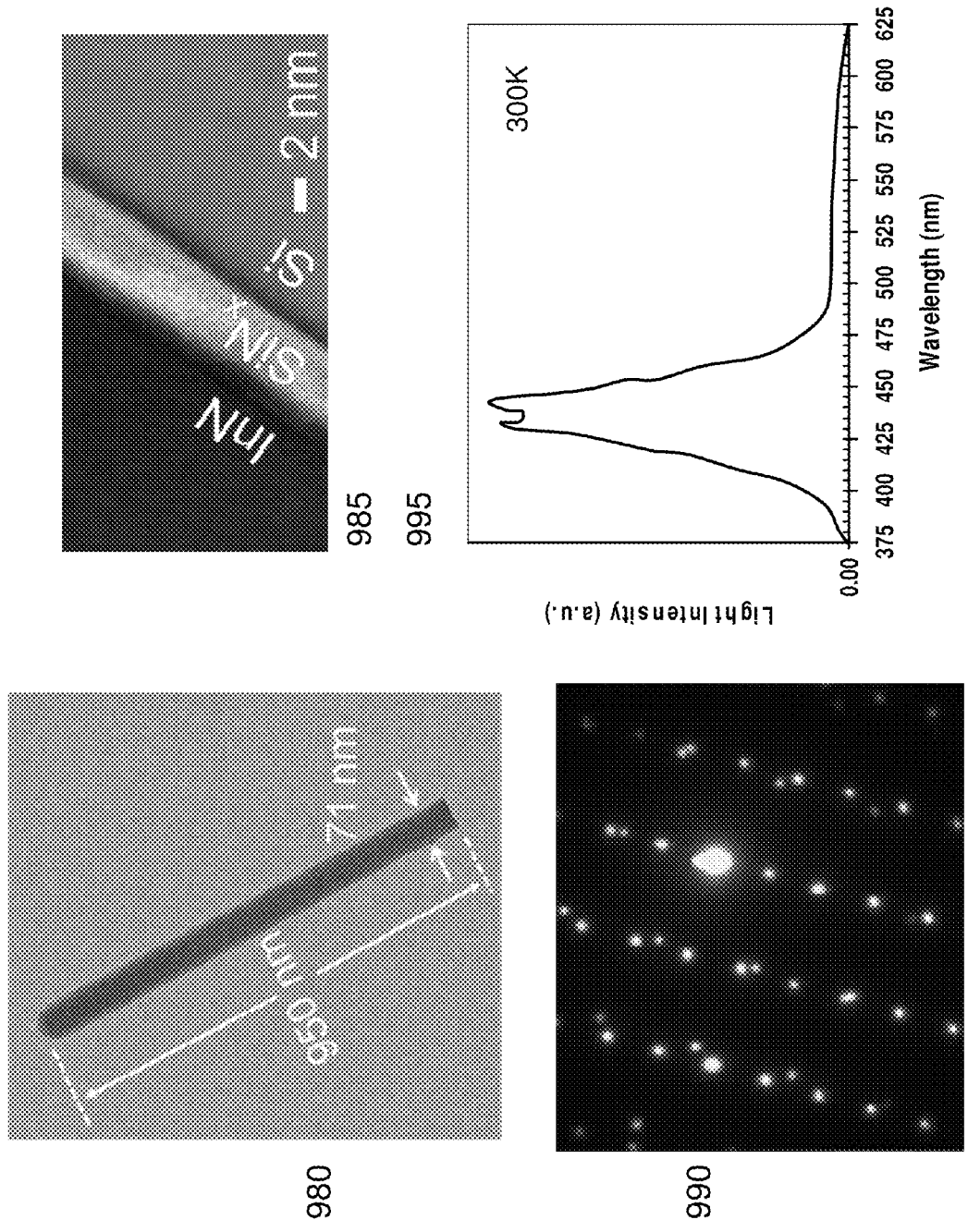
FIG. 9D depicts foreign catalyst free grown InN nanowires according to the prior art of Y. Chang et al.

The structural properties of InN nanowires on Si were also studied by high resolution transmission electron microscopy (TEM) as shown in FIG. 9D by first TEM image 980 of a non-tapered InN nanowire transferred on a carbon membrane on a TEM grid. It is evident that the nanowire is structurally uniform, with a constant diameter of ~71 nm along the wire of ~0.95 mm. By varying growth time, non-tapered InN nanowires with lengths in the range of 0.1 mm to 5 µm have been achieved. The high resolution TEM images and selected area electron diffraction patterns 990 reveal that the wires exhibit a wurtzite crystal structure and have an interlunar spacing of 0.308 nm. Detailed studies confirm that the entire wire is of single crystal and relatively free of dislocations.

During the growth of InN on Si, an amorphous SiNx layer also develops at the misfit interface, which can be clearly identified from the cross-sectional TEM image of InN/Si interface region, shown in second TEM image 985. The presence of such an amorphous layer can severely limit the formation and properties of InN on Si. According to the prior art for thick (>2 nm-3 nm) SiNx amorphous layers, vertically oriented InN nanowires cannot be grown, see J. Grandal et al "Accommodation Mechanism of InN Nanocolumns Grown on Si (111) Substrates by Molecular Beam Epitaxy" (Appl. Phys. Lett., Vol. 91). With the use of an In seeding layer, however, single crystalline InN nanowires, that are relatively free of dislocations and stacking faults, can be achieved on Si even with the presence of a relatively thick (>4 nm-5 nm) SiNx layer, illustrated in second TEM image 985. The selected area electron diffraction measured for the InN nanowire and Si substrate interface region is shown in electron diffraction patter 990, which consists of diffraction patterns for both the InN nanowire and the Si substrate. The perfect epitaxial alignment between Si(111) and InN(0001) is attributed to the pre-deposited In droplets, which act as seeds for the nucleation and growth of InN nanowires.

Using the same methodology but with increased substrate temperatures, ~800° C., GaN nanowires of uniform diameter, height and crystalline structure relatively free of defects have also been grown. Referring to spectrum 995 there is shown the emission spectrum for a nanowire laser grown on n-type silicon substrate comprising 0.5 µm GaN nanowires doped with silicon to provide the lower n-type GaN material, and active region consisting of three InGaN quantum wells separated by GaN spacers, and magnesium (Mg) doped GaN to form the upper p-type GaN. Upper electrical connection being provided via an indium tin electrode. Spectrum 995 shows emission for this nanowire laser at $\lambda_{peak} \approx 440$ nm at 300K with high efficiency for such a GaN LED with InGaN/GaN quantum wells.

Figure 10:
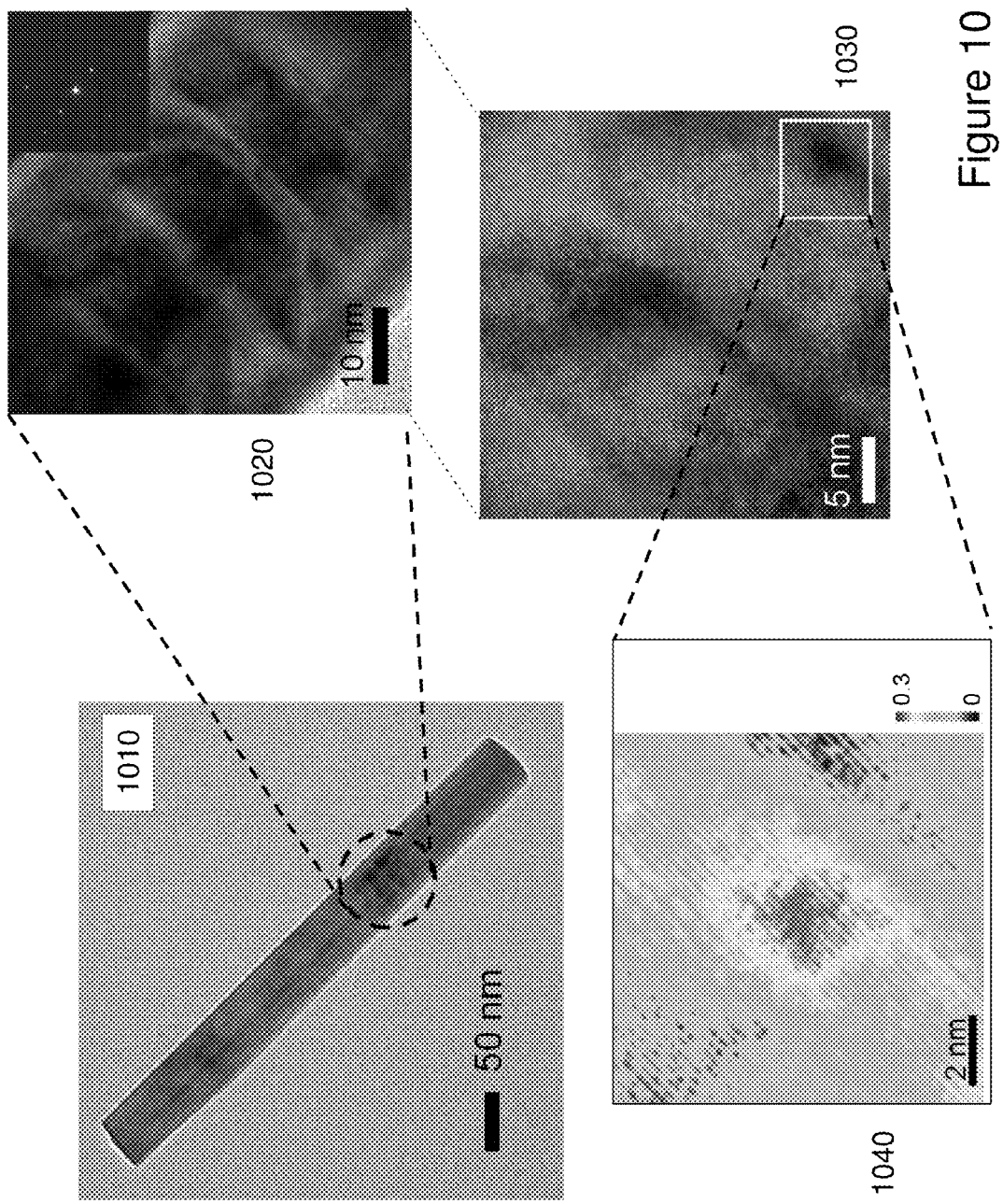
FIG. 10 depicts foreign catalyst free grown GaN nanowires with quantum-dot-within-a-quantum dot heterostructures for implementing high efficiency green, yellow or red light sources.

With this ability to form very high quality and uniform nanowires which are relatively defect free, it is feasible to consider growing so called dot-within-a-dot-in-a-nanowire heterostructures, employing quantum dots formed within the nanowires, for efficient photon generation. Referring to FIG. 10 such a dot-within-a-dot-in-a-nanowire hetero structure is shown in first SEM micrograph 1010. The InGaN/GaN dot-within-a-dot-in-a-wire hetero structures were grown directly onto silicon substrates (<111>) and consist of approximately 0.5 μm GaN n-type atop of which three vertically aligned quantum dots separated by approximately 5 nm GaN barrier layers were grown followed by an approximately 0.3 μm p-type GaN capping layer. According to this embodiment of the approach of Y. Chang and Z. Mi a thin layer of gallium is initially deposited forming nano scale liquid droplets on the surface of the silicon wafer, which form the nucleation sites for the growth of the GaN upon introduction of the ammonia precursor along with the trimethylgallium. The substrate temperature for GaN nanowires was approximately 800° C., which was lowered to approximately 550° C. during the growth of InGaN quantum dots. InGaN/GaN dot-within-a-dot-in-a-wire samples with different emission wavelengths were grown by varying the In/Ga flux ratios.

It can be seen in first SEM micrograph 1010 that the nanowire as grown are vertically aligned and exhibit a diameter of approximately 50 nm. The nanowire densities can be varied from $\sim 1\times10^9$ to $1\times10^{10}$ cm$^{-2}$ by changing the growth temperature and N/Ga flux ratios. It can also be seen in first SEM micrograph 1010 that the vertically aligned InGaN quantum dots can be identified. The InGaN/GaN nanowire is structurally uniform with a length of ~0.8 μm. Also shown in FIG. 10 is high resolution TEM image 1020 for the quantum dot active region as highlighted in first SEM micrograph 1010 for the three vertically aligned InGaN quantum dots, which are located at the center of the wire, and have been formed by the strain-induced self-organization. They exhibit a height of ~7 nm and a width of ~30 nm, which are larger than the commonly reported values for InGaN/GaN quantum dots embedded in planar heterostructures, see K. Tachibana et al (IEEE J. Sel. Top. Quantum., Vol. 6, pp 475, 2000). The InGaN quantum dots and surrounding GaN barrier layers are nearly free of dislocations, due to the reduced strain distribution in the nanowire heterostructures grown according to an embodiment of the invention.

The average In compositions in the dots are estimated to be in the range of ~15 to ~25%, depending on the growth conditions, for green, yellow, and amber/red light emitting structures. It was also noted that a small amount (~6%) of In atoms are incorporated in the GaN barrier layers. Also shown in FIG. 10 is detailed TEM image 1030 which shows the presence of the In-rich nanoclusters, small quantum dots, thereby leading to the unique dot-in-a-dot heterostructures which due to their close spacing may be electronically coupled. These In-rich nanoclusters are formed by phase segregation, and their sizes vary from ~2 nm to ~5 nm from measurements on dot-within-a-dot-in-a-nanowires grown under varying conditions according to the embodiments of the invention. Also shown in FIG. 10 is an In composition distribution profile 1040, derived from the Vegard's law, for the selected region in detailed TEM image 1130. This shows an In-rich nanocluster with an In composition of ~28% and dimensions of ~3.5 nm.

Figure 11:
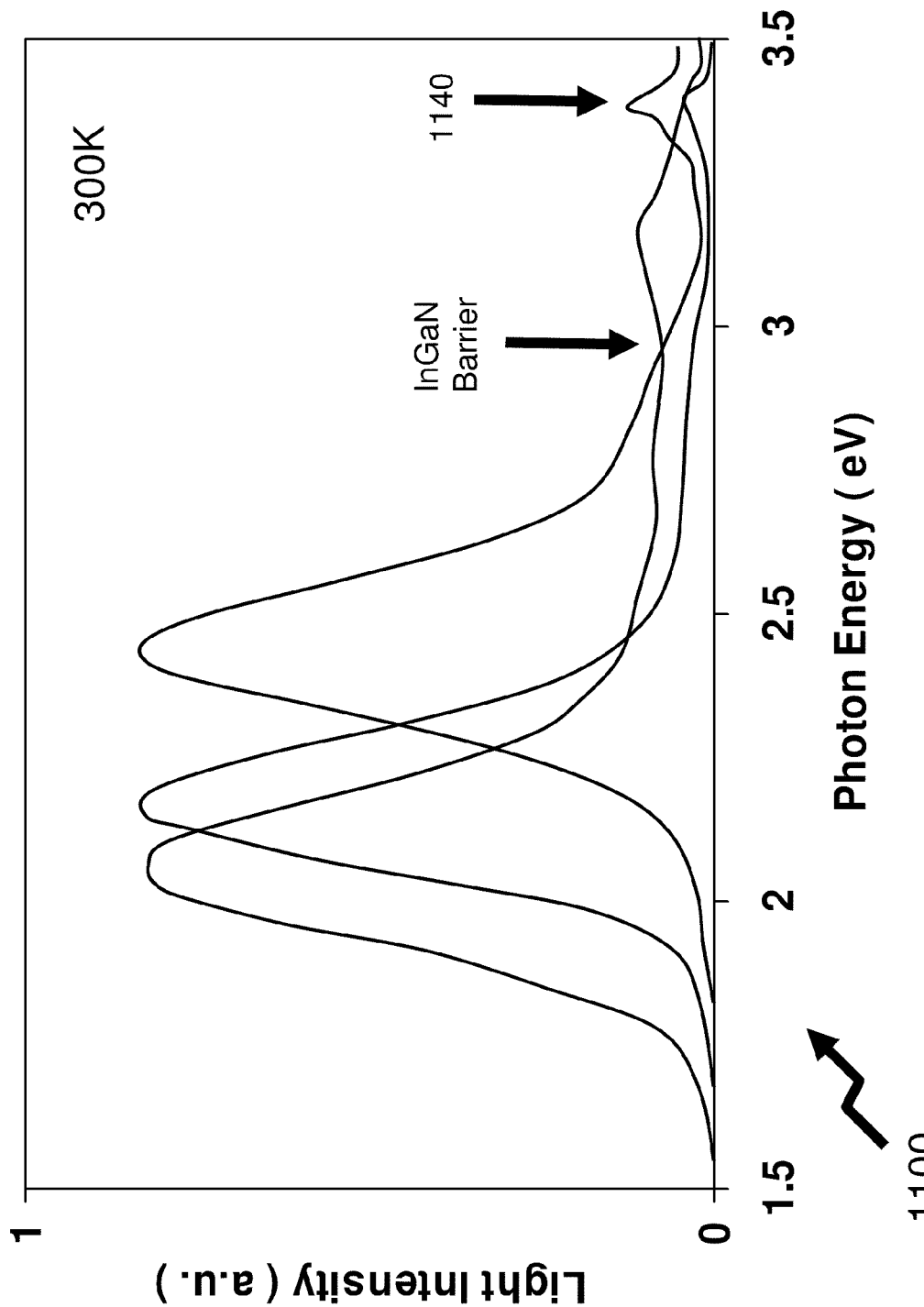
FIG. 11 depicts the emission spectra for LEDs employing GaN nanowires with quantum-dot-within-a-quantum dot heterostructures operating within the green, yellow and amber/red portions of the visible spectrum.

Optical properties of these InGaN/GaN dot-within-a-dot-in-a-nanowires nanoscale heterostructures were studied using temperature variable photoluminescence spectroscopy. FIG. 11 shows the normalized PL spectra 1100 measured at room temperature for three InGaN/GaN dot-within-a-dot-in-a-nanowire heterostructures grown with different In/Ga flux ratios. The peak energy positions are at ~2.5 eV, ~2.2 eV, and ~2.0 eV, corresponding to green (~495 nm), yellow (~565 nm) and amber/red (~620 nm) emission, respectively. The measured spectral linewidths are in the range of ~200 meV to 260 meV. For all three samples, luminescence emission from the GaN nanowires themselves can also be observed as peak 1140 at ~3.4 eV (~365 nm). The intensity of this emission however is significantly smaller than that of the InGaN quantum dots, in spite of the thick GaN segments surrounding the quantum dot layers. This further confirms the excellent optical quality of InGaN quantum dots. It may also be noted that a weak photoluminescence emission at ~3.0 eV (~415 nm) can also be measured, which is likely from the portion of surrounding GaN barrier layers that incorporates the small (~6%) amount of In atoms, due to phase segregation.

Figure 12:
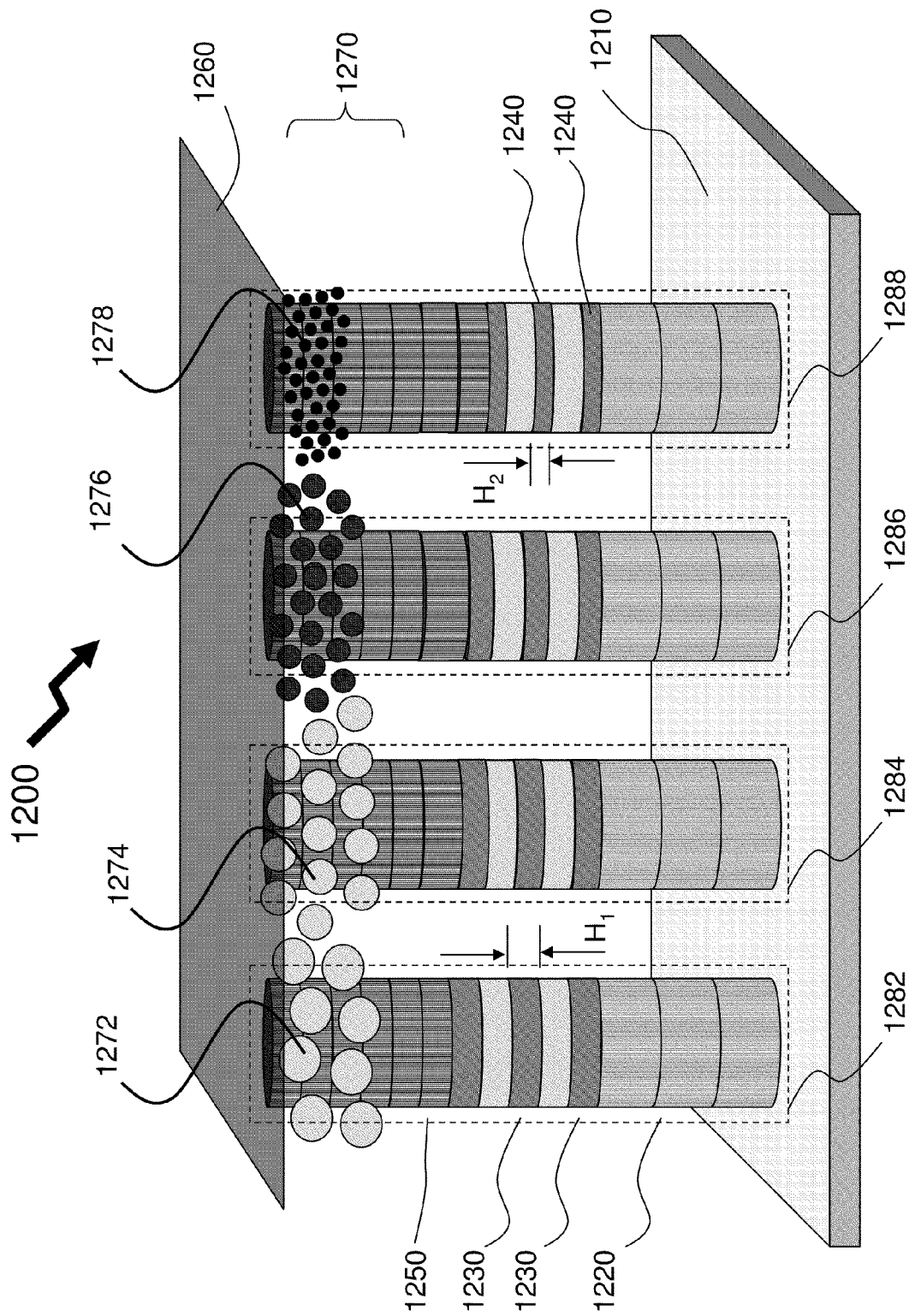
FIG. 12 depicts a broadband light source employing defect free InN nanowires and colloidal quantum dots according to an embodiment of the invention.

Referring to FIG. 12 there is depicted of a high efficiency broadband light source 1200 according to an embodiment of the invention. Shown are shown first through fourth heterostructures 1282 through 1288 which for example are grown upon an n-type silicon substrate 1210 and comprise 0.5 μm GaN nanowires doped with silicon to provide the lower n-type GaN material 1220. The device active region consists of three InGaN quantum wells 1230 separated by GaN spacers 1240. Atop the three InGaN/GaN quantum wells magnesium (Mg) doped GaN is grown to form the p-type GaN 1250. In this embodiment the three InGaN quantum wells 1230 vary in thickness from a first height H$_1$ for first hetero structure 1282 to a second height H$_2$ for the fourth hetero structure 1288 such that their emission wavelengths vary. Next first to fourth colloidal quantum dots 1272 to 1278 respectively are coated onto the surface after a planarization process to infill around the nanowires. The upper surfaces of the nanowires are then exposed using a selective etching process followed by the deposition of the ITO upper contact 1260. As the first to fourth colloidal quantum dots 1272 to 1278 largely reside above the InGaN/GaN quantum well regions their presence does not affect significantly the current flow, contact resistance or recombination process within the InGaN/GaN quantum well heterostructures. A portion of the emitted photons from the InGaN/GaN nanowires will be absorbed by the first to fourth colloidal quantum dots 1272 to 1278 and "down converted" to photons with colors determined by the size and composition of the first to fourth colloidal quantum dots 1272 to 1278.

According to the embodiment of the invention the first heterostructure 1282 with height H$_1$ in its InGaN quantum wells 1230 emits at a first wavelength which is designed to resonantly pump the first colloidal quantum dots 1272, second heterostructure 1284 the second colloidal dots 1274, third heterostructure 1286 the third colloidal dots 1276, and fourth heterostructure 1288 with height H$_2$ in its InGaN quantum wells 1230 emits at a fourth wavelength which is designed to resonantly pump the fourth colloidal quantum dots 1272.

It would be evident to one skilled in the art that the first to fourth heterostructures 1282 to 1288 may be designed to emit at different wavelengths by varying the In/Ga ratio of the InGaN quantum wells 1230. Further it would be evident that additional heterostructures may be implemented in combination with these heterostructure/quantum dot structures to provide for example additional wavelengths to pump other quantum dots as well as providing optical signals to be amplified by the quantum dots.

Figure 13:
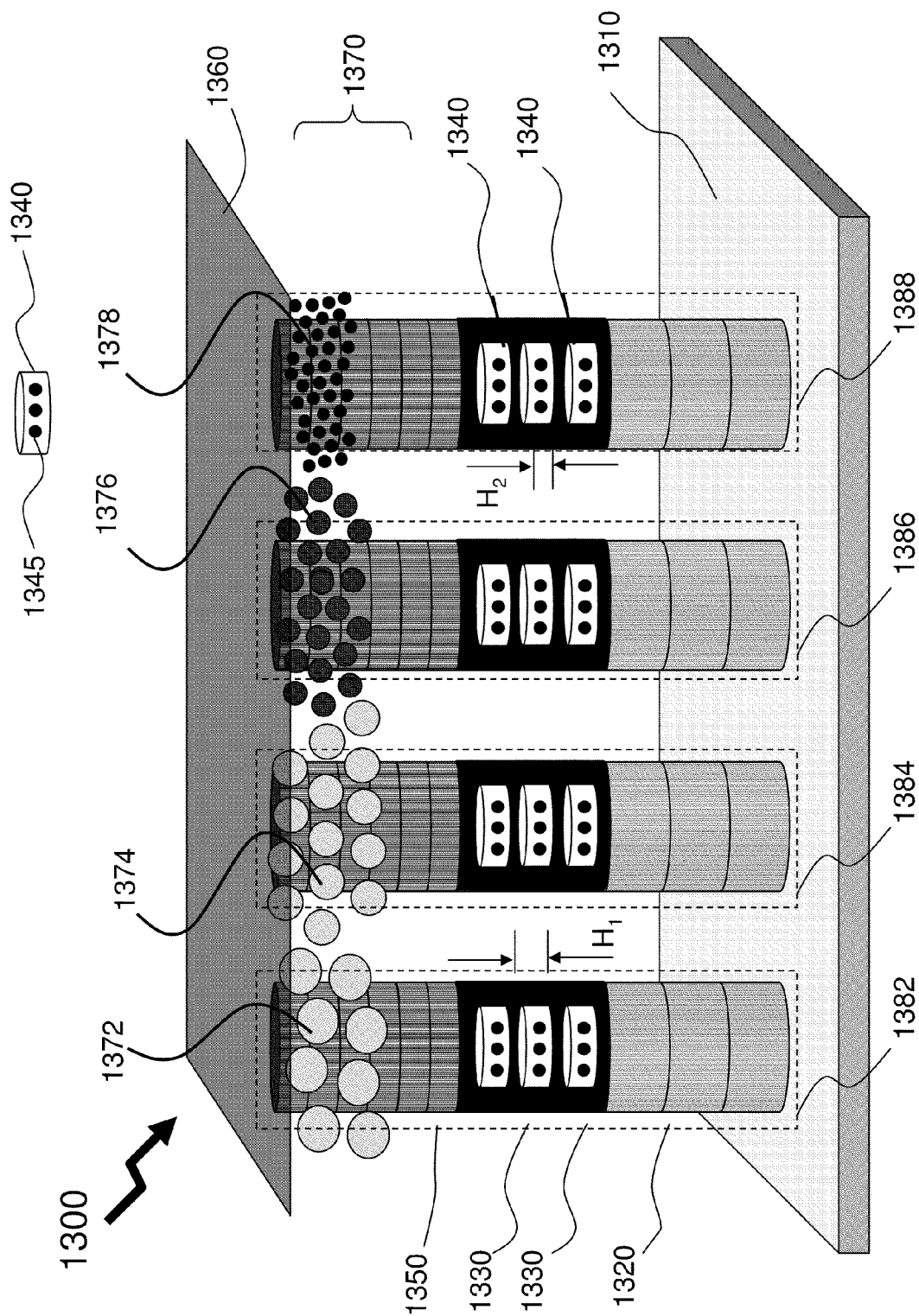
FIG. 13 depicts a broadband light source employing defect free GaN nanowires with quantum-dot-within-a-quantum dot hetero structures and colloidal quantum dots according to an embodiment of the invention.

Referring to FIG. 13 there is shown another embodiment of the invention for providing a high efficiency broadband light source 1300. Shown are shown first through fourth dot-within-a-dot-in-a-nanowire emitters 1382 through 1389 which for example are grown upon an n-type silicon substrate 1310 and comprise a GaN buffer 1320, three vertically aligned large quantum dots 1340 within GaN barriers 1330, and a GaN capping layer 1350. An ITO electrode 1360 is formed on top of the GaN capping layer 1350 to provide the top electrode to the first through fourth dot-within-a-dot-in-a-nanowire light emitters 1382 through 1388. As outlined supra in respect of FIG. 11 the very high quality, relatively defect free, and uniform growth provided by nanoparticle droplet initiation provides localized In rich nanoclusters can form within each large quantum dot 1340 as it is grown, thereby forming small quantum dots 1345 within each of the large quantum dots 1340.

As with high efficiency broadband light source 1200 in FIG. 12 supra the high efficiency broadband light source 1300 is formed with first through fourth colloidal quantum dots 1372 to 1378. As such first dot-within-a-dot-in-a-nanowire emitter 1382 with its InGaN quantum wells 1330 of height $H_1$ emits at a first wavelength which is designed to resonantly pump the first colloidal quantum dots 1372, second dot-within-a-dot-in-a-nanowire emitter 1284 the second colloidal dots 1374, third dot-within-a-dot-in-a-nanowire emitter 1286 the third colloidal dots 1376, and fourth dot-within-a-dot-in-a-nanowire emitter 1388 its InGaN quantum wells 1330 of height $H_2$ emits at a fourth wavelength which is designed to resonantly pump the fourth colloidal quantum dots 1372.

It would be evident to one skilled in the art that the first to fourth dot-within-a-dot-in-a-nanowire emitters 1382 to 1388 may be designed to emit at different wavelengths by varying the In/Ga ratio of the InGaN quantum wells 1330. Further it would be evident that additional heterostructures may be implemented in combination with these heterostructure/quantum dot structures to provide for example additional wavelengths to pump other quantum dots as well as providing optical signals to be amplified by the quantum dots.

Figure 14:
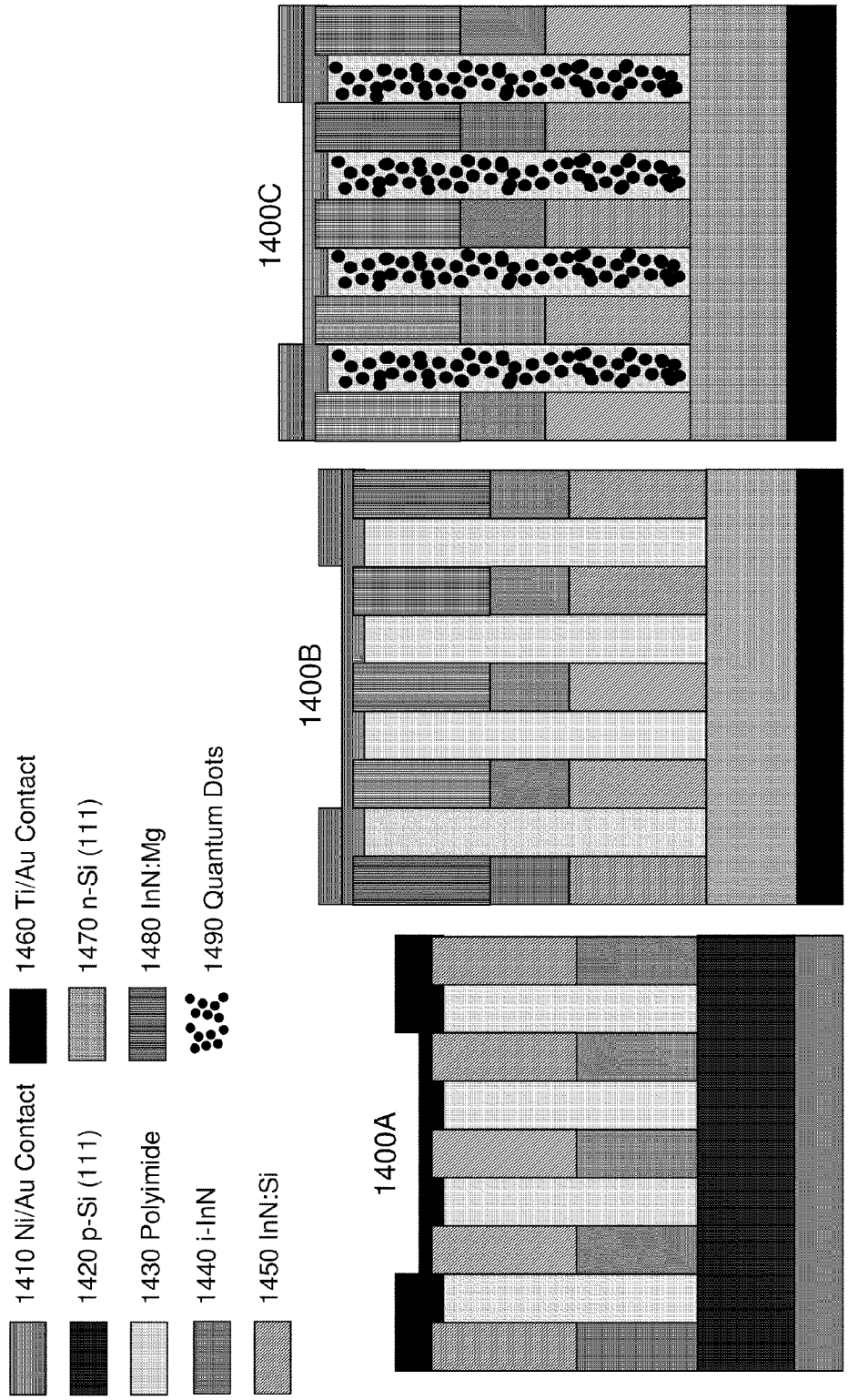
FIG. 14 depicts schematic designs for InN nanowire solar cells according to embodiments of the invention.

Referring to FIG. 14 there are depicted schematic designs 1400A to 1400D for InN nanowire solar cells according to embodiments of the invention. First solar cell 1400A the InN nanowire solar cells consist of 0.3 μm non-doped (intrinsic) InN 1440 with 0.4 μm Si-doped InN 1450 sections, which are grown directly on p-type Si(111) 1420 substrate. The InN nanowires are separated by polyimide 1430, and first solar cell 1400A having lower contact of Ni/Au 1410 and top contact Ti/Au 1460. Such a design does not require the use of p-type InN nanowires, which had not been demonstrated prior to the invention described in this specification, but could not be implemented through poor morphology, varying nanowire height, etc. Second and third solar cells 1400B and 1400C respectively employ InN p-i-n axial homojunctions which comprise of ~0.8 μm InN:Si 1450, 0.2 μm non-doped InN (intrinsic) 1440, and 0.3 μm InN:Mg 1480 sections grown on n-type Si(111) 1470 substrates.

Compared to first solar cell 1400A these p-n junctions are formed within the InN nanowires. It may be noted that a small variation in the thicknesses of the device intrinsic regions i-InN 1440 may arise, which does not have any major impact on the device efficiency. Second and third solar cells employing Ni/Au 1410 upper contacts and Ti/Au 1460 contacts. In all solar cell designs the top/upper contact is approximately 15 nm thick. One of the primary limitations for semiconductor nanowire devices is the significant non-radiative carrier recombination associated with the presence of surface states, which can be greatly minimized by using core-shell or dot/well-in-a-wire nanoscale heterostructures, see Y. L. Chang et al in "High Efficiency Green, Yellow, and Amber Emission from InGaN/GaN Dot-in-a-Wire Heterostructures on Si (111)" (Appl. Phys. Lett., Vol. 96, p. 013106). Accordingly third solar cell 1400C employs CdSe quantum dots 1490 disposed between the p-i-n nanowires. Accordingly excitons are created by light absorption with the quantum dots 1490 and their energy transferred to an adjacent high carrier mobility transport medium, the nanowires.

The fabrication process for InN nanowire solar cells on Si according to second solar cell 1400B begins with a polyimide (PI) 1430 resist layer that is first spin-coated to fully cover the InN nanowires for surface planarization. The PI layer is subsequently etched using O2:CF4 (1:4) dry etching until the top region of the wires is exposed. The wafer is then flood-exposed with UV light and hard-baked at ~350° C. for ~30 minutes to cure the PI. The top exposed section of the wires is patterned, using standard photolithography, into cells of various sizes (0.09 mm2 up to 1.00 mm2) and, a thin Ni/Au 1410 (~5 nm/~10 nm) p-metal contact is deposited on the cell surface, which is followed by the deposition of thick Ni/Au metal contact layers at the periphery of the devices. Ti/Au 1460 (30 nm/150 nm) layers are then deposited on the backside of the n-Si 1470 substrate as the n-metal contact. The sample is annealed at 300-400° C. for 60 seconds.

The quantum dots 1490 may be either provided with a size distribution to provide the broad wavelength range of absorption or that the solar cell may be implemented with a plurality of regions, each region containing quantum dots 1490 within a narrower range of dimensions but where a number of regions provide the full wavelength coverage, in a manner similar to that in FIG. 13.

Figure 15:
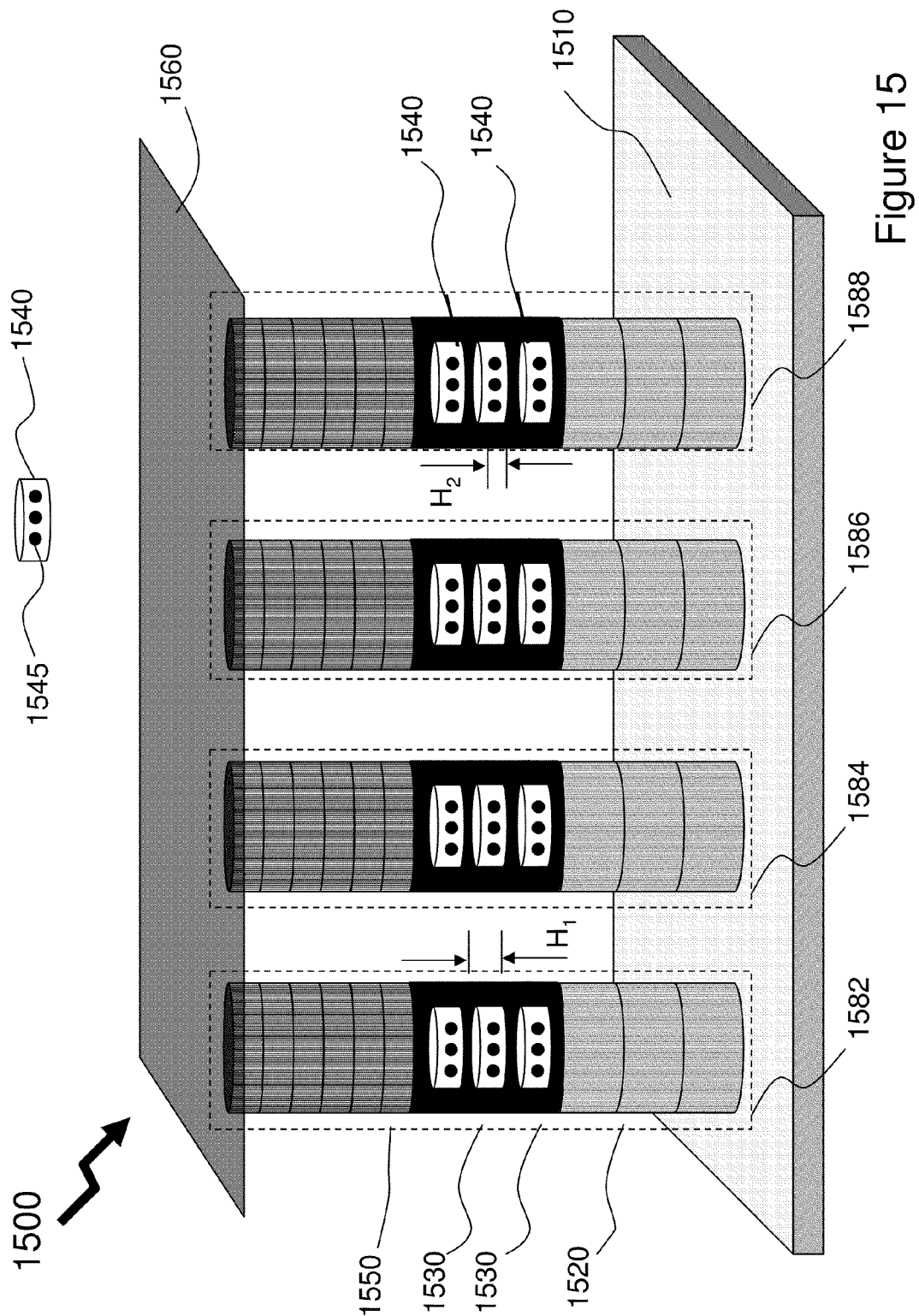
FIG. 15 depicts a schematic design for a dot-in-a-wire solar cell according to an embodiment of the invention.

Referring to FIG. 15 there is shown another embodiment of the invention for providing a high efficiency broadband solar cell 1500. Shown are first through fourth dot-within-a-dot-in-a-nanowire absorbers 1582 through 1589 which for example are grown upon an n-type silicon substrate 1510 and comprise a GaN buffer 1520, three vertically aligned large quantum dots 1540 within GaN barriers 1530, and a GaN capping layer 1550. An ITO electrode 1560 is formed on top of the GaN capping layer 1550 to provide the top electrode to the first through fourth dot-within-a-dot-in-a-nanowire light emitters 1582 through 1588. As outlined supra in respect of FIG. 11 the very high quality, relatively defect free, and uniform growth provided by nanoparticle droplet initiation provides localized In rich nanoclusters can form within each large quantum dot 1540 as it is grown, thereby forming small quantum dots 1545 within each of the large quantum dots 1540.

As such first dot-within-a-dot-in-a-nanowire absorber 1582 with its InGaN quantum wells 1530 of height $H_1$ absorbs at a first wavelength range and fourth dot-within-a-dot-in-a-nanowire absorber 1588 its InGaN quantum wells 1530 of height $H_2$ absorbing at a fourth wavelength range. It would be evident that the quantum dots may therefore absorb at varying wavelength ranges to provide coverage of the solar spectrum with a mosaic of dot-within-a-dot-in-a-nanowire absorbers operating at different wavelength ranges. Additionally, it would be evident that the mechanisms described above in respect of size independent quantum dots may be applied to quantum dot solar cell and emitter structures including but not limited to attaching quantum dots to patterned semiconductor materials and those based around dye-sensitised colloidal titanium dioxide ($TiO_2$) films, ultraviolet, visible and infrared operation, hot injection of carriers from higher excited states to minimize energy loss, and generation of multiple electron-hole pairs from a single high energy photon.

Further whilst the implementations discussed above have been presented with respect of InN nanowires it would be evident that the nanowires may be formed from other materials including but not limited to Si, C, GaAs, InP and InGaAsP. Additionally the quantum dots may also be employed with other materials including but not limited to organic materials, polymers and plastics. Likewise whilst quantum dots have been based upon the CdSe material system it would be evident that other materials may be employed including but not limited CdTe, ZnSe, PbS, and Si, and may be single shell, dual shell, coated, uncoated designs.

Within the descriptions supra in respect of FIGS. 1A through 15 relating to the invention reference has been made to excitonic states of the quantum dot, i.e. $1S_e$, $1P_e$, $1S_{1/2}$, $1P_{1/2}$, $2S_{3/2}$ etc, it is important to note that for semiconductor quantum dots these refer to are fundamentally different situation than when considering excitonic states within bulk semiconductors. Similarly they are fundamentally different to considering electron states within other optical emission sources such as gas lasers, for example HeNe. The resonant pumping of the quantum dots to provide optical gain at all dimensions of quantum dot, which has been physically unachievable in the prior art, in describing an excitonic state relates to describing the position of the electron relative to the quantum dot itself rather than considering electrons being moved to a conduction band of a bulk semiconductor or moved to a different shell of an atom. Rather the states refer to whether the electron is either inside the quantum dot (ground state), at the surface of the quantum dot (low excitonic states), or outside the quantum dot (high excitonic states).

As such the resonant pumping relates to positioning the electron at the surface of the quantum dot in order to achieve the required minimisation of the interference from multiexcitonic interactions. Pumping the quantum dot to higher excitonic states, such as the prior art pumping with 400 nm sources, relates to positioning the electron outside the quantum dot. Further, the fact that the invention relates to the positioning of the electron at the surface of the quantum dot explains why the reduction of surface trapping of electrons by providing a shell structure over a quantum dot, i.e. ZnS shell over a CdSe core had not only a significant impact on the gain lifetime as shown supra in respect of FIG. 6 but also as to why these plots of the negative portion of the nonlinear spectrum ($OD_{NL}$) normalized to $OD_{1S}$ is nearly 2.5 times higher. Accordingly the invention may be described in relation to the controlled positioning of electrons associated with each quantum dot into a predetermined relationship to the quantum dot.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method comprising:
providing a quantum dot, the quantum dot characterized by at least a first dimension and comprising at least a shell of a first material and a first electron of a plurality of electrons;
providing an optical signal, the optical signal determined in dependence upon at least the first material and the first dimension;
coupling the optical signal to the quantum dot, the coupling moving the first electron of the plurality of electrons to a predetermined position in relationship to the surface of the quantum dot; wherein
the predetermined position is determined in dependence upon reducing a measure of interference for multiexcitonic interactions within the quantum dot such that spontaneous emission can occur from the quantum dot.

2. A method according to claim 1 further comprising;
a shell, the shell surrounding a predetermined portion of a core of the quantum dot, comprising a second material, and characterized by at least a nominal thickness.

3. A method according to claim 2 wherein,
the shell reduces a measure of surface trapping of the plurality of electrons.

4. A method according to claim 2 wherein,
at least one of the material of the shell and the nominal thickness are determined in dependence upon maximizing at least one of a decay constant associated with spontaneous emission from the quantum dot and a measure of a population of first electrons in the predetermined relationship to the surface of the quantum dot for a population of first quantum dots.

5. A method according to claim 1 wherein;
the predetermined position is approximately at the surface of the quantum dot.

6. A method comprising:
providing a plurality of quantum dots, plurality of quantum dots characterized by at least a first dimension and each comprising at least a shell of a first material and a first electron of a plurality of electrons;
providing a first optical signal, the first optical signal determined in dependence upon at least the first material and the first dimension;
providing a second optical signal, the second optical signal determined in dependence upon at least the first material and the first dimension;
coupling the first optical signal to the plurality of quantum dots, the coupling moving a first predetermined portion of the first electrons of the plurality of electrons to a first predetermined position in relationship to the surface of their respective quantum dots;
coupling the second optical signal to the plurality of quantum dots, the coupling moving a second predetermined portion of the first electrons of the plurality of electrons to a second predetermined position in relationship to the surface of their respective quantum dots; wherein
the first predetermined position is determined in dependence upon reducing a measure of interference for multiexcitonic interactions within the quantum dot such that spontaneous emission can occur from the quantum dot.

7. A method according to claim 6 wherein,
optical emission from the second predetermined portion of the plurality of quantum dots is red-shifted with respect to optical emission from the first predetermined portion of the plurality of quantum dots.

8. A method according to claim 6 further comprising;
providing each quantum dot of a third predetermined portion of the plurality of quantum dots with a shell, the shell surrounding a predetermined portion of the core of the quantum dot, comprising a second material, and characterized by at least a nominal thickness.

9. A method according to claim 8 wherein,
the shell reduces a measure of surface trapping of the plurality of electrons.

10. A method according to claim 8 wherein,
at least one of the material of the shell and the nominal thickness are determined in dependence upon maximizing at least one of a decay constant associated with spontaneous emission from the plurality of quantum dots and a measure of the first predetermined portion of the first electrons of the plurality of electrons.

11. A method according to claim 1 wherein;
the first predetermined position is approximately at the surface of the quantum dot.

12. A method comprising:
providing an optical emitter for emitting an optical signal determined in dependence upon at least a first material and a first dimension, the optical emitter comprising a semiconductor structure of which a first predetermined portion comprises a wurtzite semiconductor whose growth was initiated by providing nanoscale droplets of a group III element constituent of the wurtzite semiconductor on the surface of the substrate and absent both a foreign catalyst and other constituent elements of the wurtzite semiconductor;
providing at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein
the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

13. A device comprising:
an optical emitter for emitting an optical signal determined in dependence upon at least a first material and a first dimension, the optical emitter comprising a semiconductor structure of which a first predetermined portion comprises a wurtzite semiconductor whose growth was initiated by providing nano scale droplets of a group III element constituent of the wurtzite semiconductor on the surface of the substrate and absent both a foreign catalyst and other constituent elements of the wurtzite semiconductor;
at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein
the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

14. A method comprising
providing an optical emitter for emitting an optical signal determined in dependence upon at least a first material and a first dimension;
providing at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein
the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

15. A device comprising
an optical emitter for emitting an optical signal determined in dependence upon at least a first material and a first dimension;
at least a quantum dot of a plurality of quantum dots, each quantum dot characterized by at least the first dimension and comprising at least a shell of the first material and a first electron of a plurality of electrons, the quantum dot in a predetermined relationship with the optical emitter to receive a predetermined portion of the optical signal emitted by the optical emitter; wherein
the optical signal from the emitter would move the first electron of the quantum dot of the plurality of electrons to a predetermined position in relationship to the surface of the quantum dot such that a measure of interference for multiexcitonic interactions within the quantum dot is reduced such that spontaneous emission can occur from the quantum dot within a first predetermined wavelength range.

* * * * *